(12) United States Patent
Hsieh et al.

(10) Patent No.: US 9,349,700 B2
(45) Date of Patent: May 24, 2016

(54) SEMICONDUCTOR DEVICE AND METHOD OF FORMING STRESS-REDUCED CONDUCTIVE JOINT STRUCTURES

(71) Applicant: STATS ChipPAC, Ltd., Singapore (SG)

(72) Inventors: Ming-Che Hsieh, Chutung (TW); Chien Chen Lee, Jhubei (TW)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 14/223,695

(22) Filed: Mar. 24, 2014

(65) Prior Publication Data

US 2014/0319695 A1   Oct. 30, 2014

Related U.S. Application Data

(60) Provisional application No. 61/815,370, filed on Apr. 24, 2013.

(51) Int. Cl.
*H01L 23/00* (2006.01)
*H01L 23/31* (2006.01)

(52) U.S. Cl.
CPC ............ *H01L 24/13* (2013.01); *H01L 23/3192* (2013.01); *H01L 23/562* (2013.01); *H01L 24/03* (2013.01); *H01L 24/05* (2013.01); *H01L 23/3114* (2013.01); *H01L 24/11* (2013.01); *H01L 2224/02126* (2013.01); *H01L 2224/02145* (2013.01); *H01L 2224/02235* (2013.01); *H01L 2224/02255* (2013.01); *H01L 2224/0345* (2013.01); *H01L 2224/0346* (2013.01); *H01L 2224/03452* (2013.01); *H01L 2224/0401* (2013.01); *H01L 2224/05009* (2013.01); *H01L 2224/05022* (2013.01); *H01L 2224/05027* (2013.01); *H01L 2224/05111* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05572* (2013.01); *H01L 2224/05582* (2013.01); *H01L 2224/05611* (2013.01); *H01L 2224/05624* (2013.01); *H01L 2224/05639* (2013.01);

(Continued)

(58) Field of Classification Search
CPC ................................. H01L 24/27; H01L 24/29
USPC .......................................... 257/774; 438/652
See application file for complete search history.

(56) References Cited

U.S. PATENT DOCUMENTS 6,077,726 A    6/2000  Mistry et al.
6,348,398 B1 * 2/2002  Wang ............................ 438/601

(Continued)

*Primary Examiner* — Christine Enad
(74) *Attorney, Agent, or Firm* — Robert D. Atkins; Patent Law Group: Atkins and Associates, P.C.

(57) ABSTRACT

A semiconductor device has a substrate. A first conductive layer is formed over the substrate. A first insulating layer is formed over the substrate. A second insulating layer is formed over the first insulating layer. A second conductive layer is formed over the second insulating layer. The second insulating layer is formed to include a cylindrical shape. The second conductive layer is formed as an under bump metallization layer. A first opening is formed in the second insulating layer. A second opening is formed in the second insulating layer around the first opening in the second insulating layer. An opening is formed in the first insulating layer over the first conductive layer. An opening is formed in the second insulating layer over the first conductive layer with the opening of the first insulating layer being greater than the opening of the second insulating layer.

14 Claims, 28 Drawing Sheets

(52) U.S. Cl.
CPC ............ *H01L 2224/05644* (2013.01); *H01L 2224/05647* (2013.01); *H01L 2224/05655* (2013.01); *H01L 2224/10126* (2013.01); *H01L 2224/1134* (2013.01); *H01L 2224/1146* (2013.01); *H01L 2224/11334* (2013.01); *H01L 2224/11849* (2013.01); *H01L 2224/13022* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16237* (2013.01); *H01L 2224/2919* (2013.01); *H01L 2224/32225* (2013.01); *H01L 2224/73204* (2013.01); *H01L 2224/81191* (2013.01); *H01L 2224/81411* (2013.01); *H01L 2224/81424* (2013.01); *H01L 2224/81439* (2013.01); *H01L 2224/81444* (2013.01); *H01L 2224/81447* (2013.01); *H01L 2224/81455* (2013.01); *H01L 2224/81815* (2013.01); *H01L 2224/831* (2013.01); *H01L 2224/94* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/181* (2013.01)

(56) References Cited

U.S. PATENT DOCUMENTS

| | | | |
|---|---|---|---|
| 6,586,323 | B1 | 7/2003 | Fan et al. |
| 6,815,324 | B2 * | 11/2004 | Huang et al. .................. 438/612 |
| 6,821,876 | B2 | 11/2004 | Yang |
| 6,958,546 | B2 | 10/2005 | Fan et al. |
| 7,667,335 | B2 | 2/2010 | Lin et al. |
| 2004/0087129 | A1 * | 5/2004 | Chen et al. .................... 438/613 |
| 2007/0075423 | A1 | 4/2007 | Ke et al. |
| 2007/0290343 | A1 * | 12/2007 | Harada et al. ................. 257/737 |
| 2008/0197489 | A1 | 8/2008 | Chyi |
| 2008/0308934 | A1 * | 12/2008 | Alvarado ............ H01L 23/3171 257/738 |
| 2011/0186988 | A1 * | 8/2011 | Chen ..................... H01L 23/485 257/737 |
| 2011/0233766 | A1 | 9/2011 | Lin et al. |
| 2012/0061823 | A1 * | 3/2012 | Wu et al. ....................... 257/737 |
| 2013/0026624 | A1 | 1/2013 | Erwin et al. |
| 2013/0113095 | A1 * | 5/2013 | Chuang et al. ................ 257/737 |
| 2013/0134580 | A1 | 5/2013 | Bao et al. |
| 2013/0140691 | A1 | 6/2013 | Bao et al. |

* cited by examiner

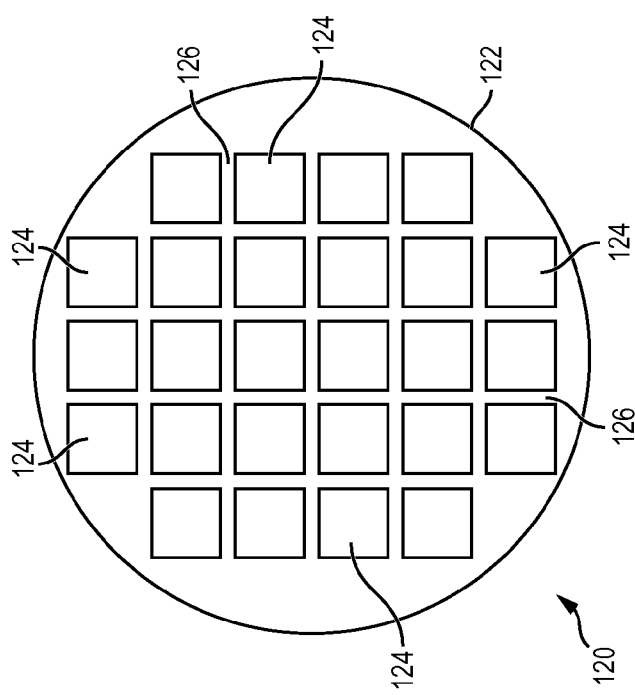
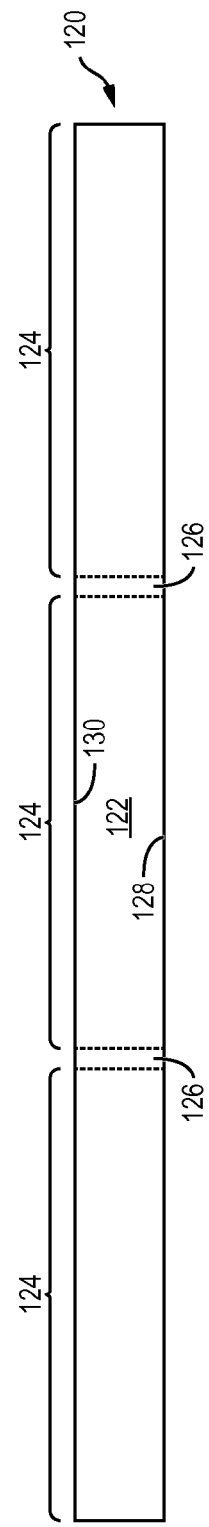
FIG. 2a
FIG. 2b

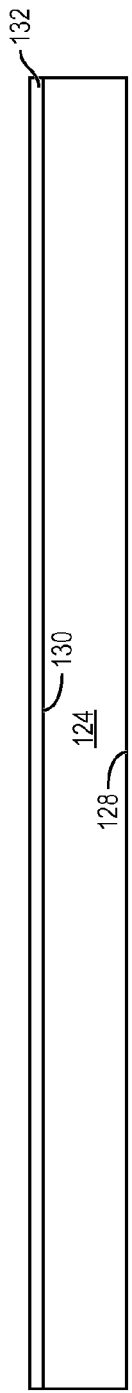
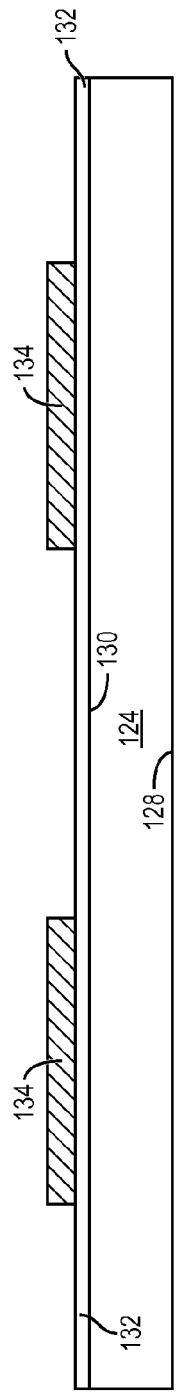
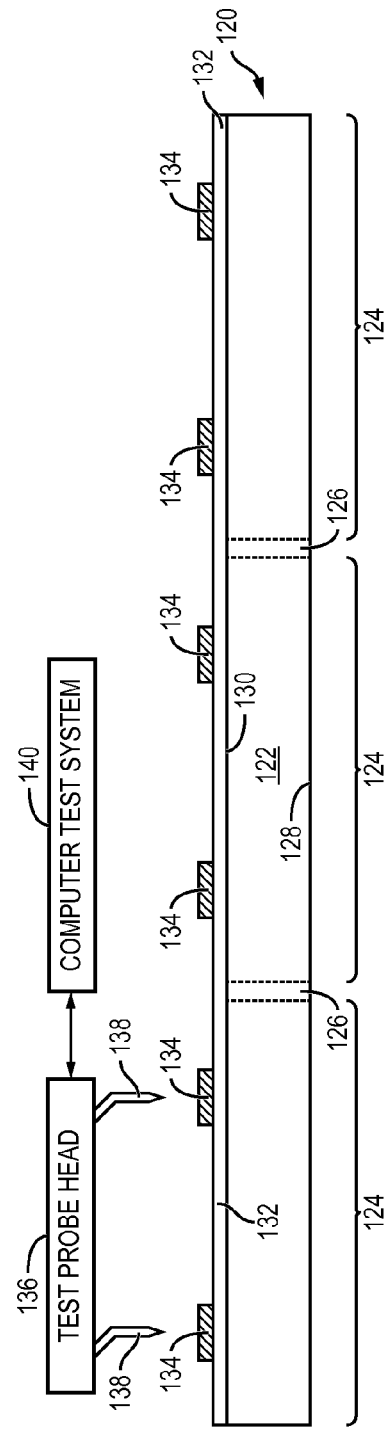

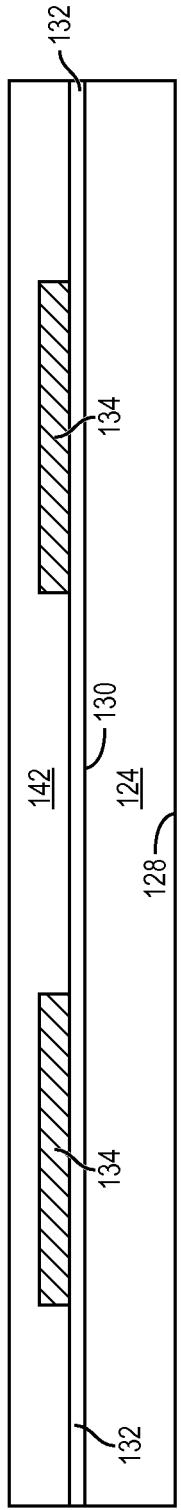
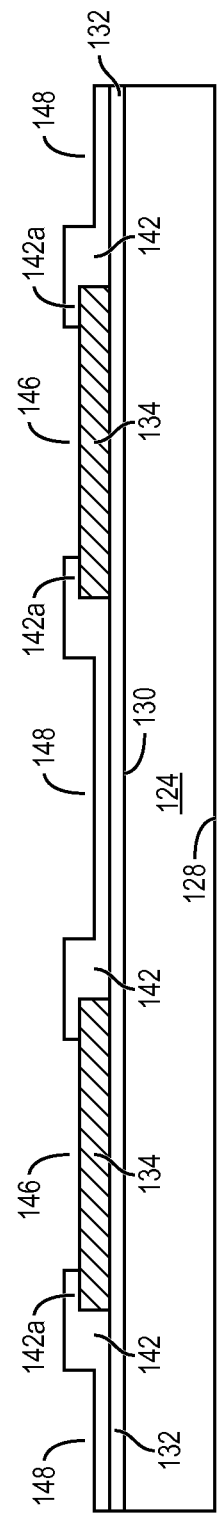
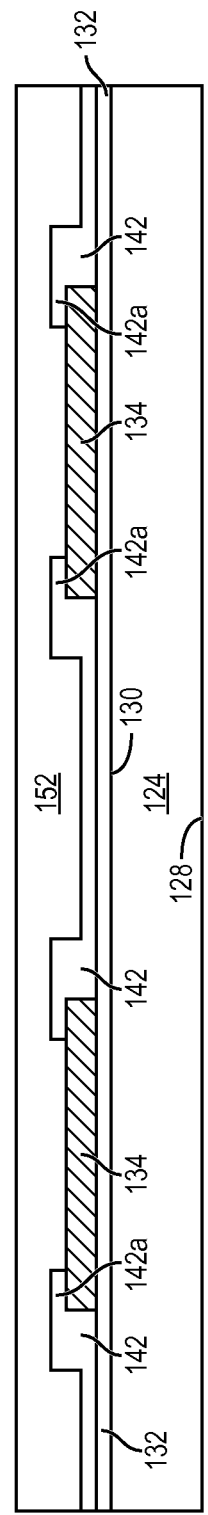

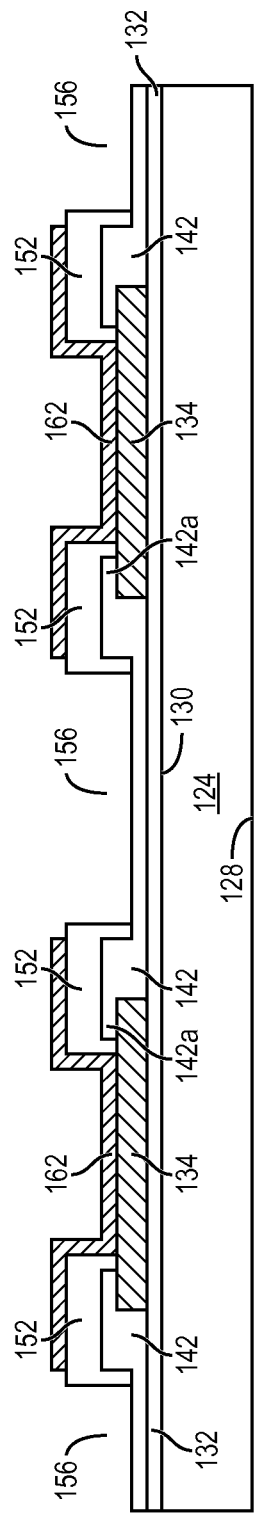
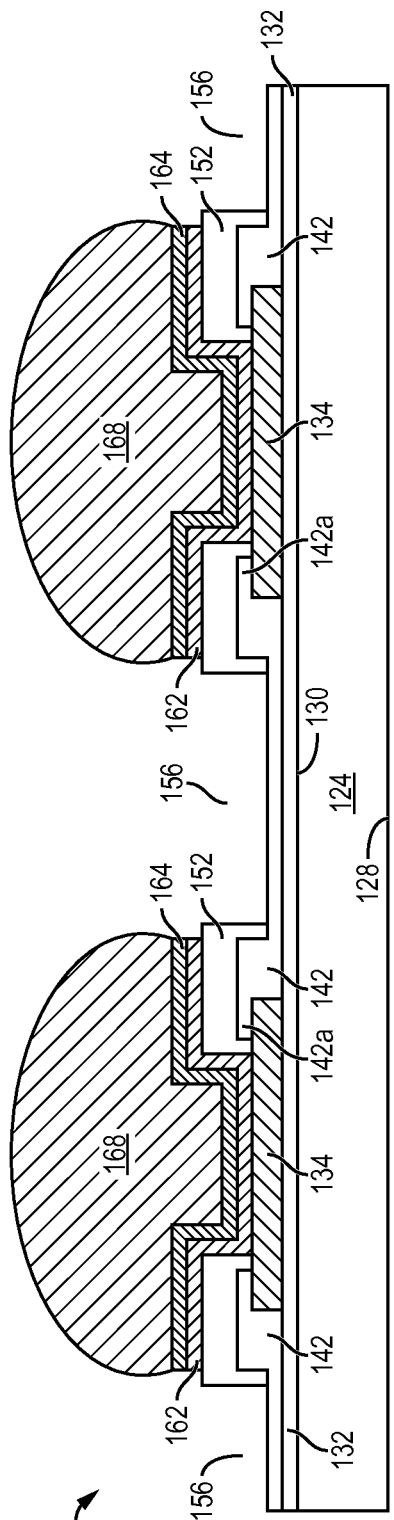

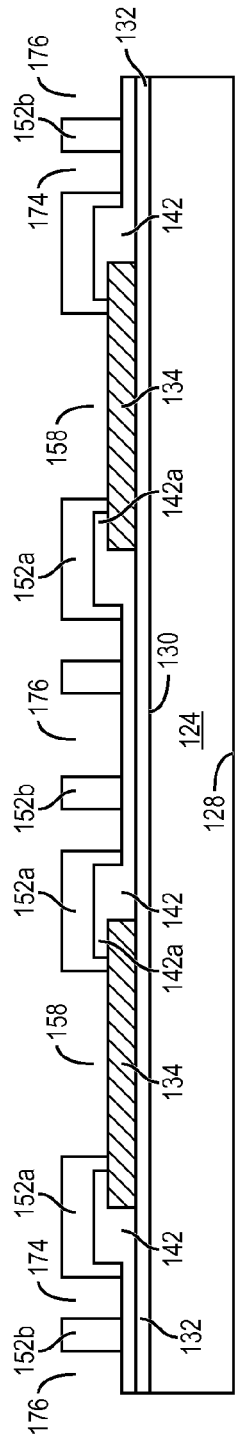
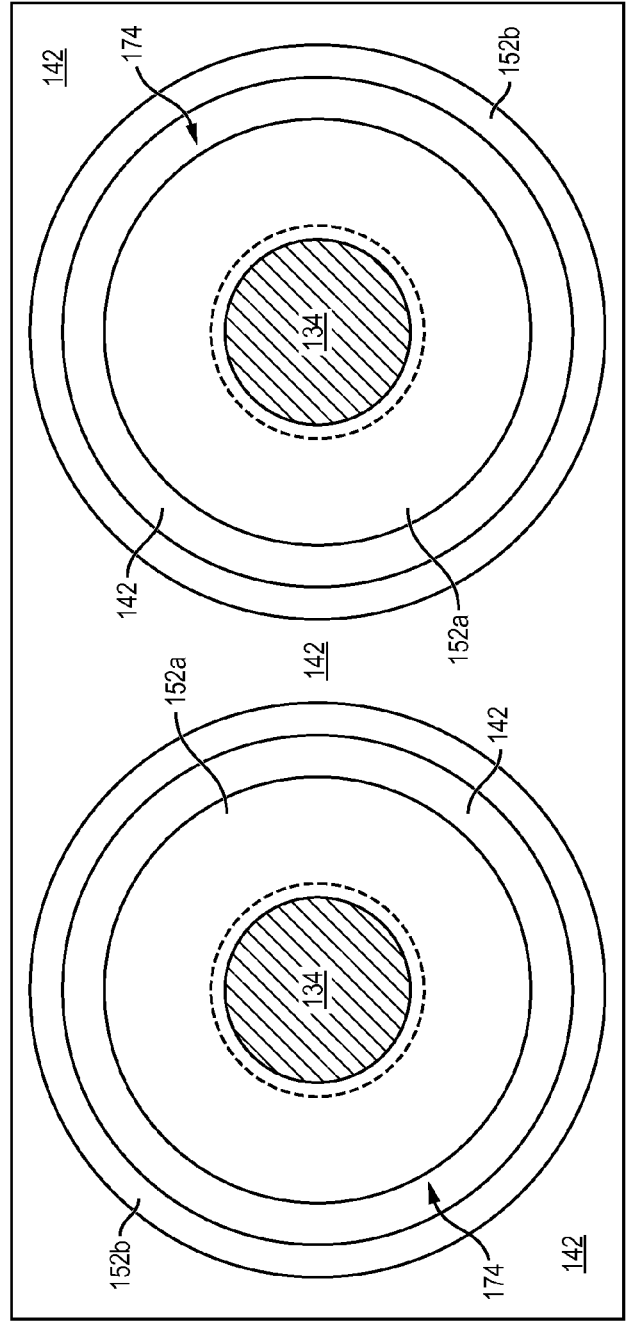
FIG. 5a
FIG. 5b

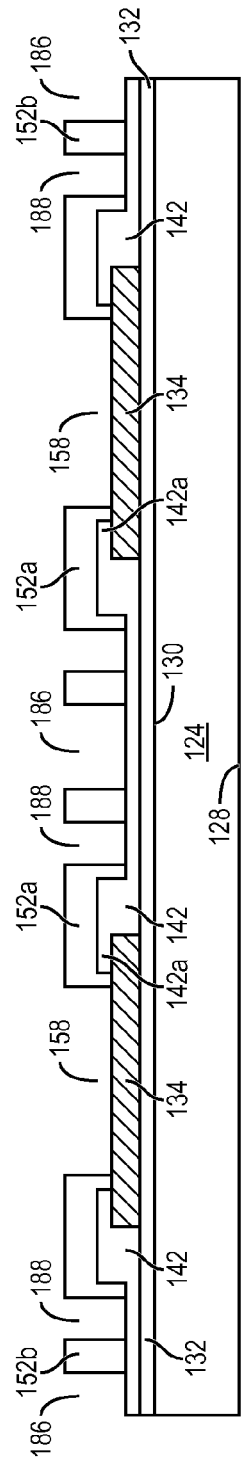
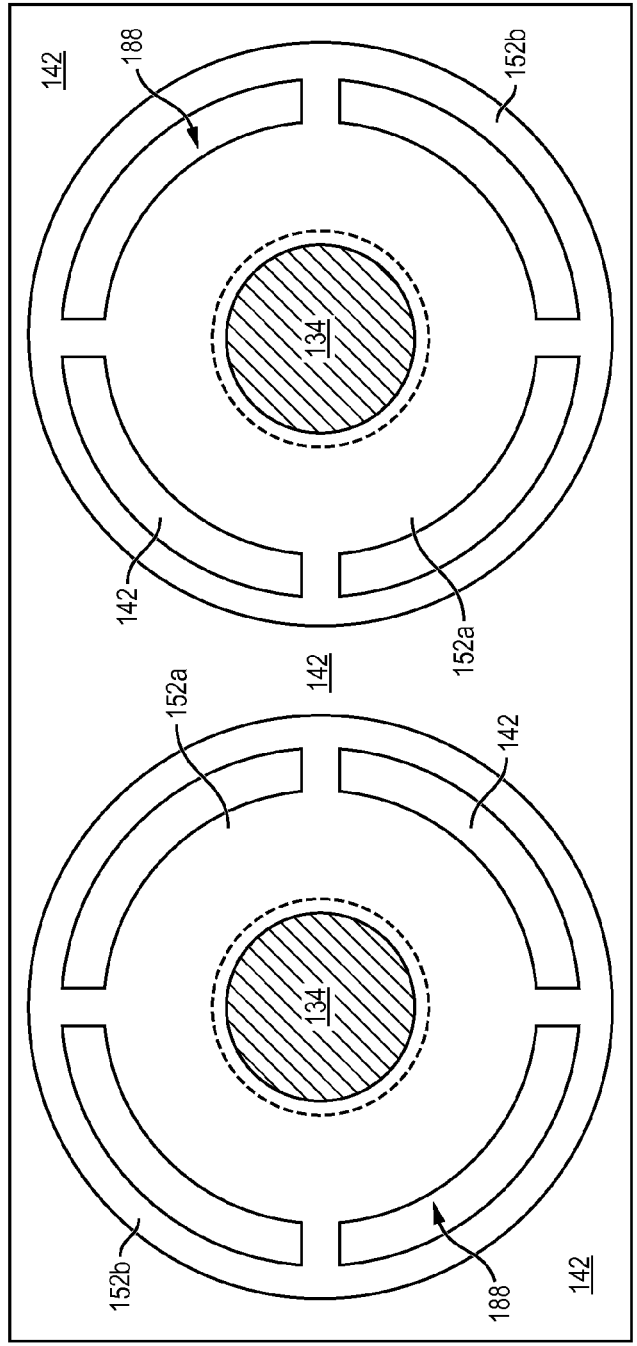
FIG. 6a
FIG. 6b

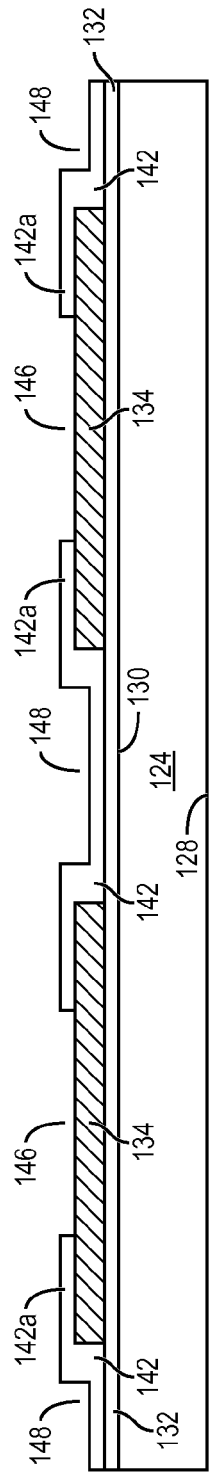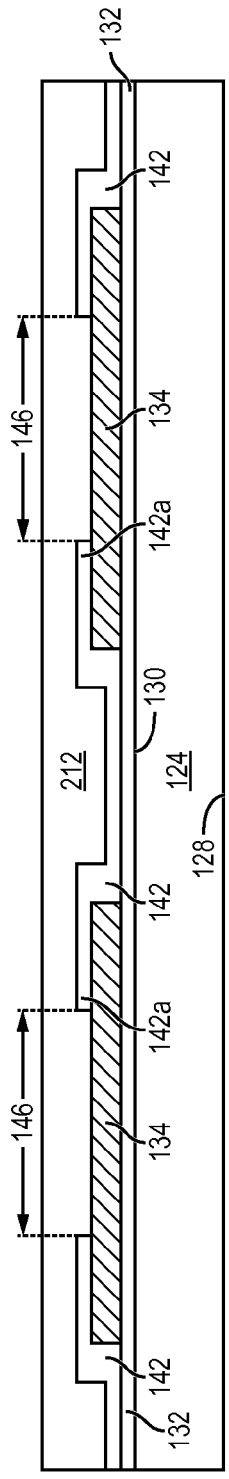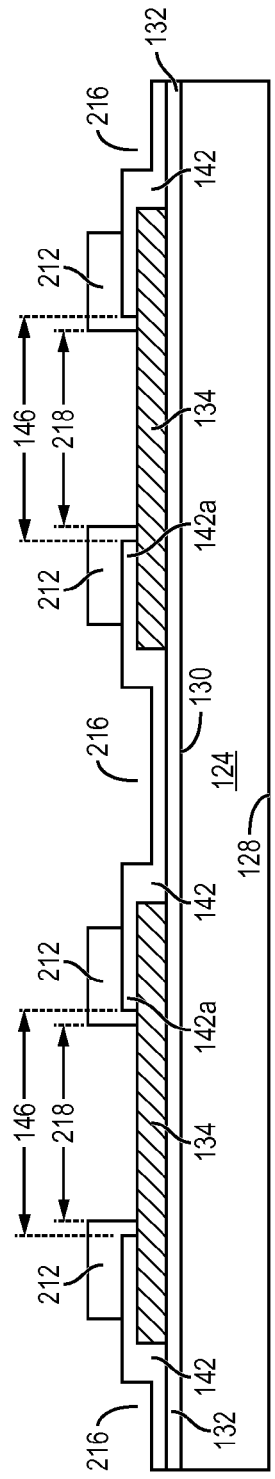

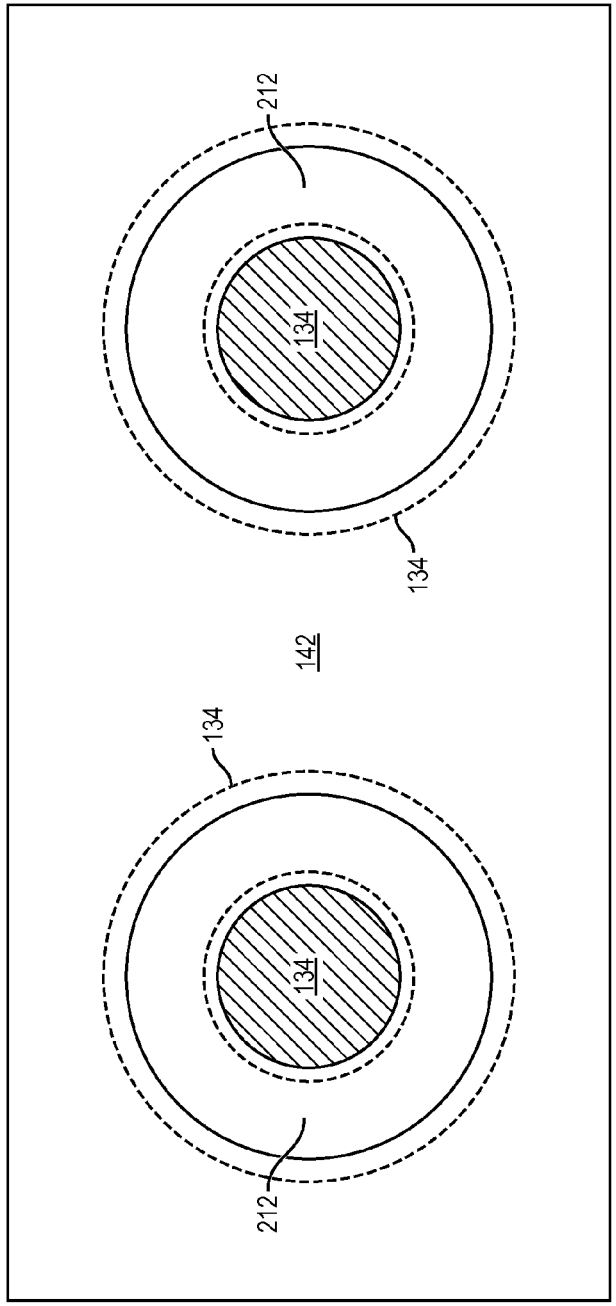
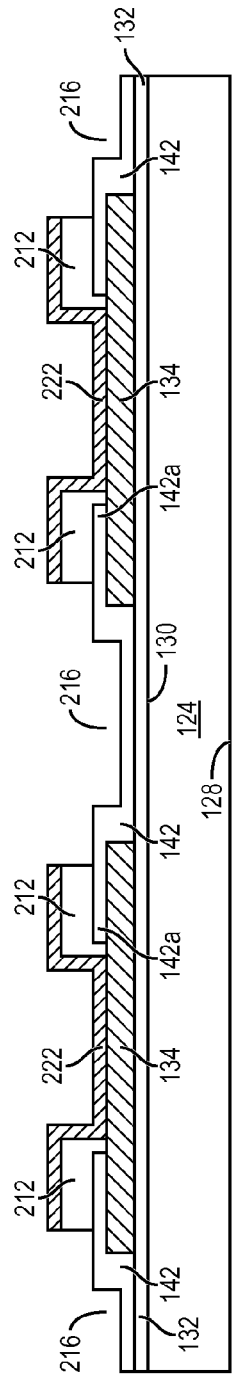
FIG. 9d
FIG. 9e

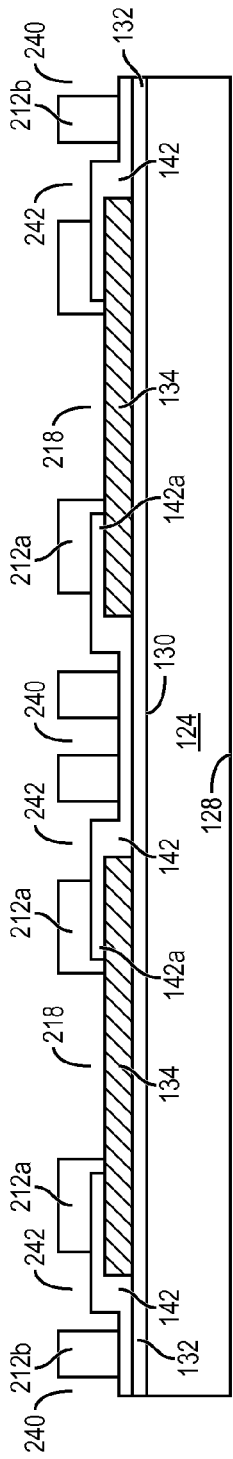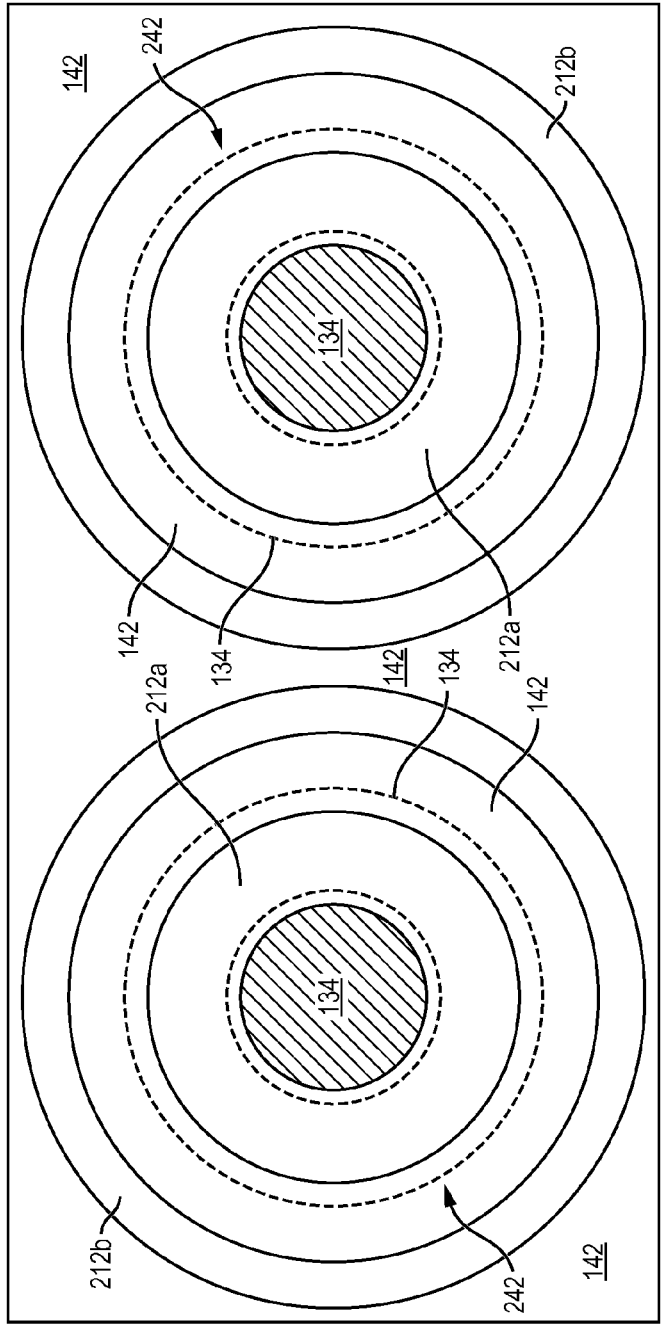
FIG. 10a
FIG. 10b

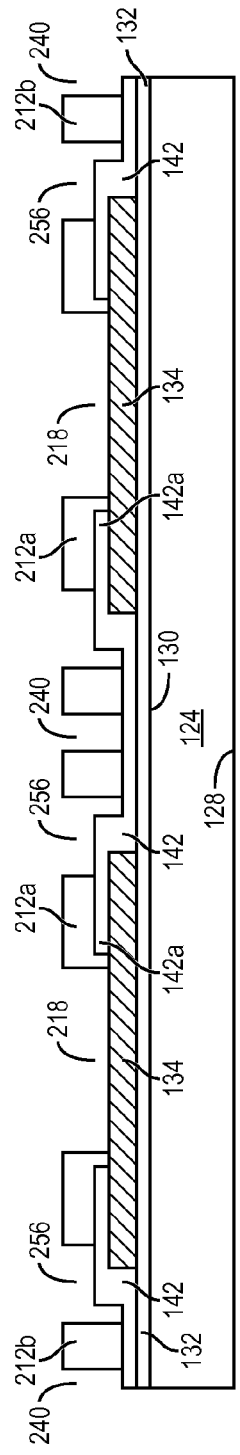
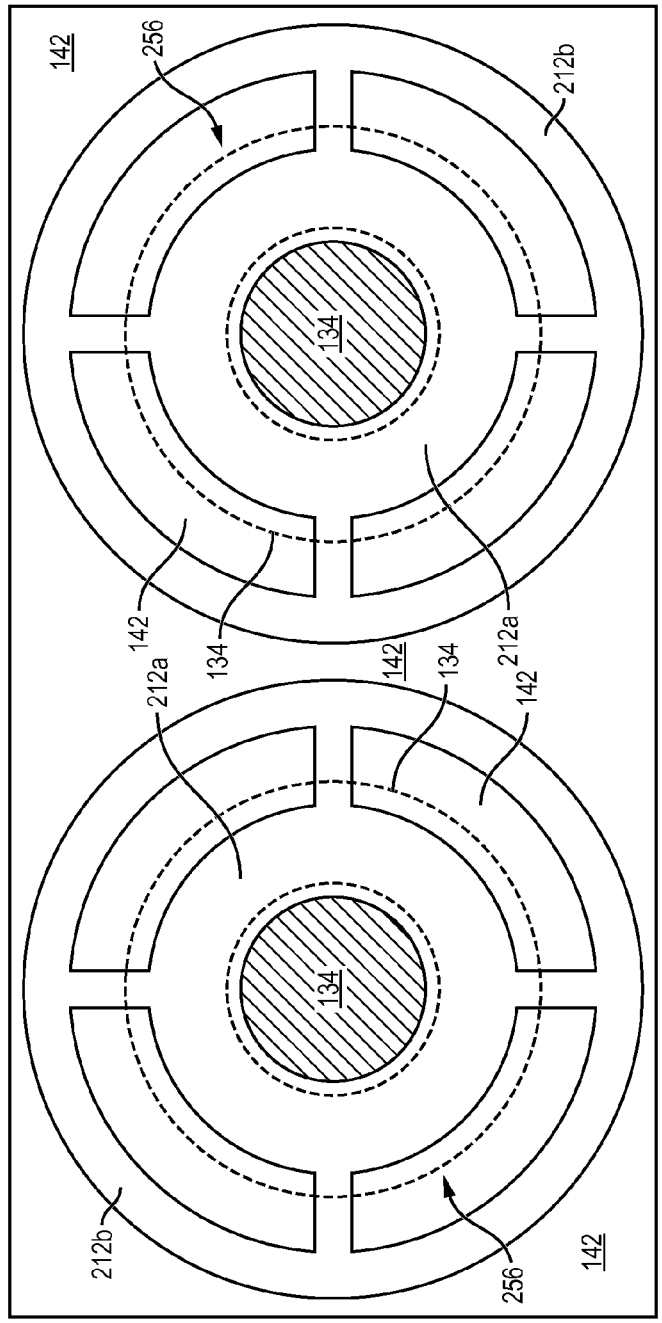

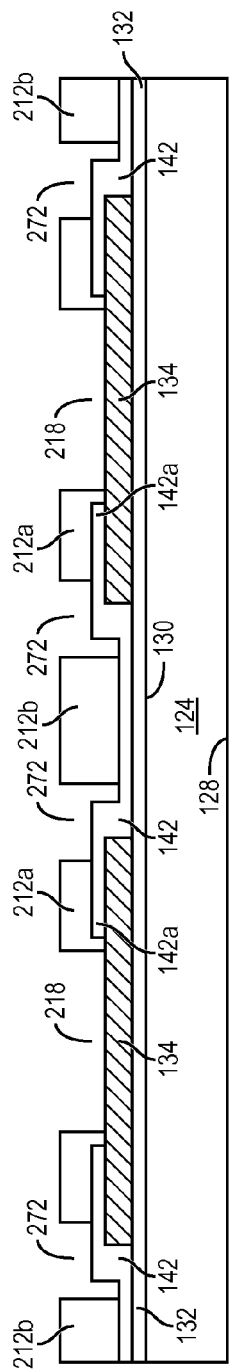
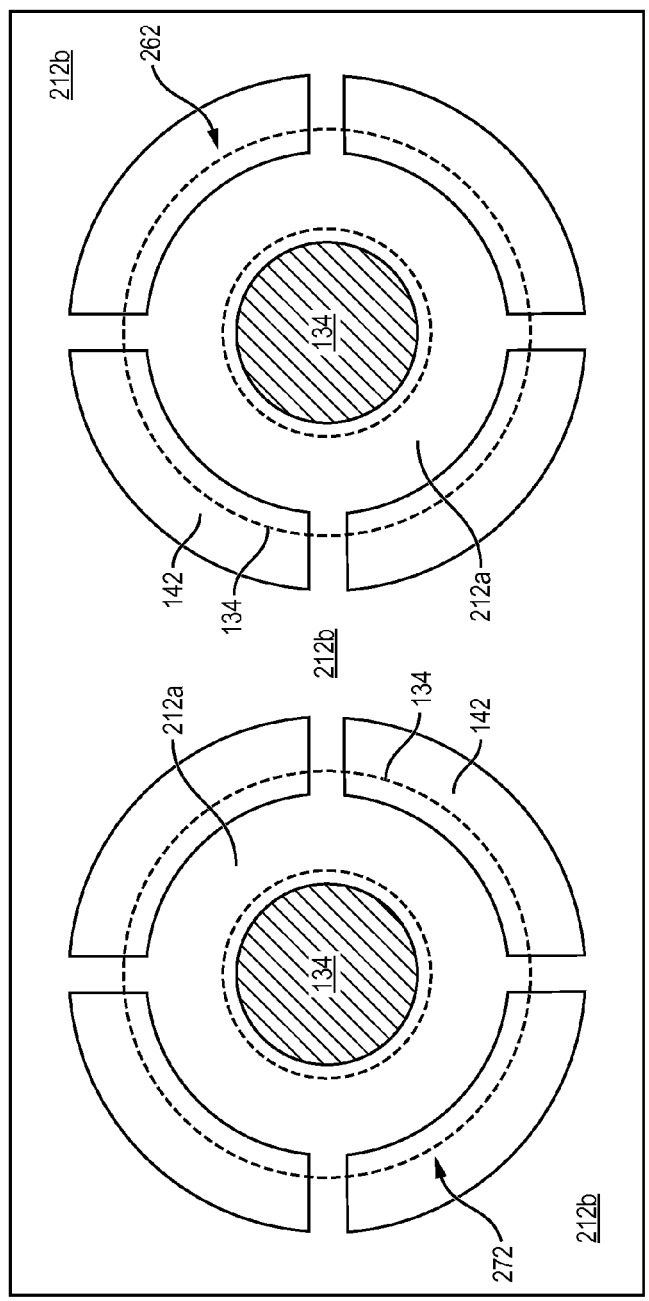
FIG. 13a
FIG. 13b

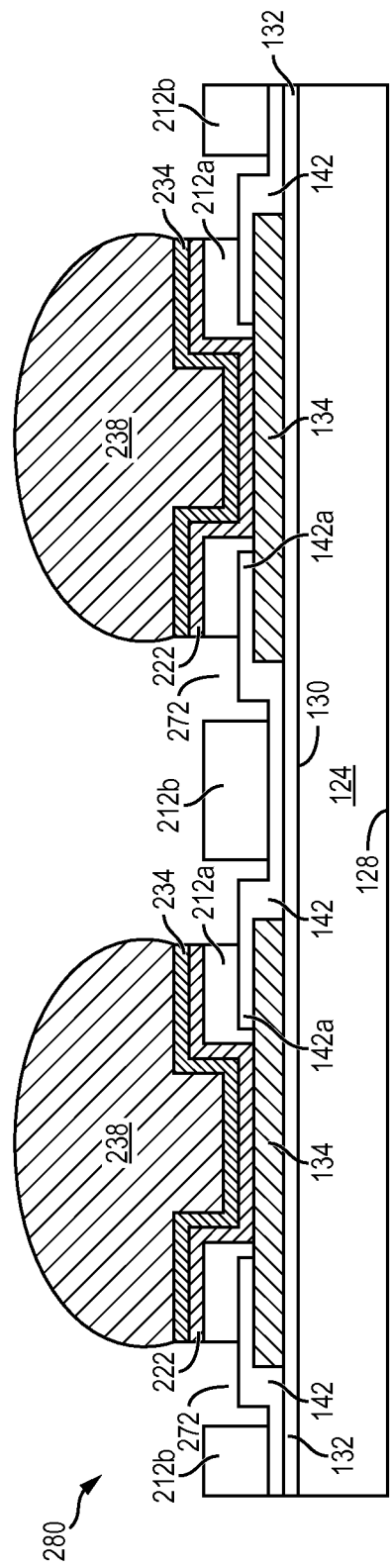

SEMICONDUCTOR DEVICE AND METHOD OF FORMING STRESS-REDUCED CONDUCTIVE JOINT STRUCTURES

CLAIM TO DOMESTIC PRIORITY

The present application claims the benefit of U.S. Provisional Application No. 61/815,370, filed Apr. 24, 2013, which application is incorporated herein by reference.

FIELD OF THE INVENTION

The present invention relates in general to semiconductor devices and, more particularly, to a semiconductor device and method of forming stress-reduced conductive joint structures.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

As electronic products demand smaller semiconductor devices and higher performance, various packaging types such as ball grid array (BGA), flip chip, and wafer level chip scale package (WLCSP) are being developed and refined. Flip chip technology, using copper pillars and solder cap bumps, is a popular packaging option to deliver lead-free, fine pitch, high input/output (I/O) density, and smaller form factor. For a successful packaging solution, a reliable conductive joint structure, such as a solder joint structure, is key to providing electrical connection between the semiconductor device and additional electronic devices.

Building a conductive joint structure typically involves forming a passivation layer over the active surface and contact pads of a semiconductor die. An insulating layer, such as a polyimide layer, is formed over the active surface and contact pads. A portion of the insulating layer is removed to expose the contact pads. A plurality of bumps is formed over the exposed contact pads for electrical interconnect. An under-bump metallization (UBM) layer and intermetallic compound (IMC) layers are formed between the bumps and contact pads. An extremely-low dielectric constant (ELK) insulating layer may further be formed beneath the contact pads. The polyimide insulating layer is used as a stress relief buffer and plays an important role in the reliability of flip chip products, especially when the silicon node moves to 65 μm or below. However, the placement of a polyimide layer can be complicated due to, e.g., the difference in material properties between the polyimide layer and other semiconductor components that make up the conductive joint structure. Existing conductive joint structures include the standard structure and the polyimide over UBM (POU) structure. The standard structure involves disposing the polyimide layer as a flat, continuous layer covering the entire passivation layer. The POU structure involves forming the UBM over the contact pads, and then forming the polyimide layer over the UBM.

In many cases, excessive levels of stress imposed upon a conductive joint structure may cause failure phenomena such as UBM delamination, IMC stress, ELK cracking, and bump cracking which in turn reduces reliability and manufacturing yield. For example, the passivation layer around the contact pads is known to crack, particularly around the edge of the contact pad due to stress imposed by the bumps. The passivation layer cracking leads to defects and other reliability problems.

The standard and POU structures are limited to stress minimization at specific areas of the conductive joint structure and are insufficient for minimizing the totality of stress issues imposed on a conductive joint structure. For example, standard conductive joint structures lack sufficient means for addressing high levels of mechanical stress imposed on the bumps, particularly at the edges of the bumps near the interface with the UBM. Standard conductive joint structures further exhibit weak stress relief along the polyimide layer due to the larger continuous profile of the polyimide layer used with standard structures. POU structures, on the other hand, exhibit weak stress relief with respect to IMC layers and have increased metal-to-metal contact.

SUMMARY OF THE INVENTION

A need exists for an improved conductive joint structure that can minimize the totality of stress issues imposed on insulating and conductive layers formed over the contact pads of a semiconductor die. Accordingly, in one embodiment, the present invention is a method of making a semiconductor device comprising the steps of providing a substrate, forming a first conductive layer over the substrate, forming a first insulating layer over the substrate, forming a second insulating layer over the first insulating layer, and forming a second conductive layer over the second insulating layer.

In another embodiment, the present invention is a method of making a semiconductor device comprising the steps of providing a substrate, forming a conductive layer over the substrate, forming a first insulating layer over the conductive layer, and forming a second insulating layer over the first insulating layer.

In another embodiment, the present invention is a semiconductor device comprising a substrate. A first conductive layer is formed over the substrate. A first insulating layer is formed over the substrate. A second insulating layer is formed over the first insulating layer.

In another embodiment, the present invention is a semiconductor device comprising a substrate. A conductive layer is formed over the substrate. A first insulating layer is formed over a portion of the conductive layer.

BRIEF DESCRIPTION OF THE DRAWINGS

FIGS. 2a-2b illustrate a semiconductor wafer with a plurality of semiconductor die separated by a saw street;

FIGS. 3a-3c illustrate further detail of the semiconductor die shown in FIG. 2b including testing of the semiconductor die;

FIGS. 4a-4g illustrate a process of forming a conductive joint structure over a semiconductor die;

FIGS. 5a-5c illustrate another embodiment of a conductive joint structure formed over a semiconductor die using a process similar to FIGS. 4a-4g;

FIGS. 6a-6c illustrate another embodiment of a conductive joint structure formed over a semiconductor die using a process similar to FIGS. 4a-4g;

FIGS. 9a-9f illustrate another process of forming a conductive joint structure over a semiconductor die;

FIGS. 10a-10c illustrate another embodiment of a conductive joint structure formed over a semiconductor die using a process similar to FIGS. 9a-9f;

FIGS. 11a-11c illustrate another embodiment of a conductive joint structure formed over a semiconductor die using a process similar to FIGS. 9a-9f;

FIGS. 13a-13c illustrate another embodiment of a conductive joint structure formed over a semiconductor die using a process similar to FIGS. 9a-9f.

DETAILED DESCRIPTION OF THE DRAWINGS

Figure 1:
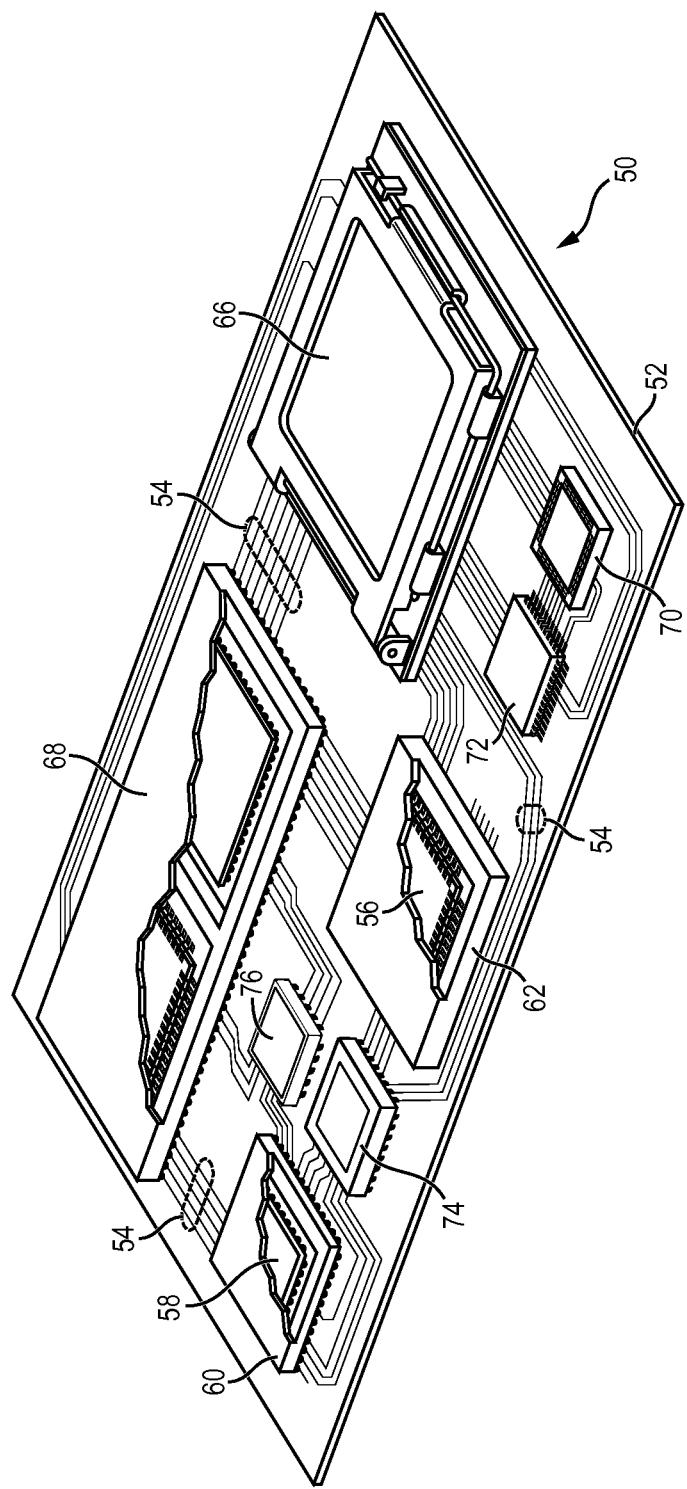
FIG. 1 illustrates a printed circuit board (PCB) with different types of packages mounted to a surface of the PCB.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, embedded wafer level ball grid array (eWLB) 74, and wafer level chip scale package (WLCSP) 76 are shown mounted on PCB 52. eWLB 74 is a fan-out wafer level package and WLCSP 76 is a fan-in wafer level package. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

FIG. 2a shows a semiconductor wafer 120 with a base substrate material 122, such as silicon, germanium, aluminum phosphide, aluminum arsenide, gallium arsenide, gallium nitride, indium phosphide, silicon carbide, or other bulk semiconductor material for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 120 has a width or diameter of 200-300 millimeters (mm). In another embodiment, semiconductor wafer 120 has a width or diameter of 100-450 mm.

FIG. 2b shows a cross-sectional view of a portion of semiconductor wafer 120. Each semiconductor die 124 has a back or non-active surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

FIGS. 3a-3c illustrate further detail of the semiconductor die shown in FIG. 2b including testing of the semiconductor die. FIG. 3a shows a cross-sectional view of a portion of semiconductor wafer 120. In FIG. 3a, an insulating or passivation layer 132 is formed over active surface 130 of semiconductor die 124 using PVD, CVD, printing, spin coating, spray coating, sintering or thermal oxidation. The insulating layer 132 contains one or more layers of silicon dioxide (SiO2), silicon nitride (Si3N4), silicon oxynitride (SiON), tantalum pentoxide (Ta2O5), aluminum oxide (Al2O3), hafnium oxide (HfO2), benzocyclobutene (BCB), polyimide (PI), polybenzoxazoles (PBO), or other suitable insulating material. In some embodiments, insulating layer 132 includes an extremely-low dielectric constant (ELK) insulating layer.

FIG. 3b shows electrically conductive layer 134 is formed over insulating layer 132 using PVD, CVD, electrolytic plating, electroless plating process, or other suitable metal deposition process. Conductive layer 134 can be one or more layers of aluminum (Al), copper (Cu), tin (Sn), nickel (Ni), gold (Au), silver (Ag), or other suitable electrically conductive material. Conductive layer 134 operates as contact pads electrically connected to the circuits on active surface 130. Contact pads 134 can be disposed side-by-side a first distance from the edge of semiconductor die 124, as shown in FIG. 3b. Alternatively, contact pads 134 can be offset in multiple rows such that a first row of contact pads is disposed a first distance from the edge of the die, and a second row of contact pads alternating with the first row is disposed a second distance from the edge of the die.

In FIG. 3c, semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

The active and passive components within semiconductor die 124 undergo testing at the wafer level for electrical performance and circuit function. Each semiconductor die 124 is tested for functionality and electrical parameters, as shown in FIG. 3c, using a test probe head 136 including a plurality of probes or test leads 138, or other testing device. Probes 138 are used to make electrical contact with nodes or contact pads 132 on each semiconductor die 124 and provide electrical stimuli to the contact pads. Semiconductor die 124 responds to the electrical stimuli, which is measured by computer test system 140 and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

After inspection and testing, semiconductor wafer 120 can be singulated through saw street 126 using a saw blade or laser cutting tool into individual semiconductor die 124. The individual semiconductor die 124 can be inspected and electrically tested for identification of KGD post singulation. Alternatively, semiconductor die 124 are singulated after the formation of the conductive joint structures described in the subsequent paragraphs.

Figure 4D:
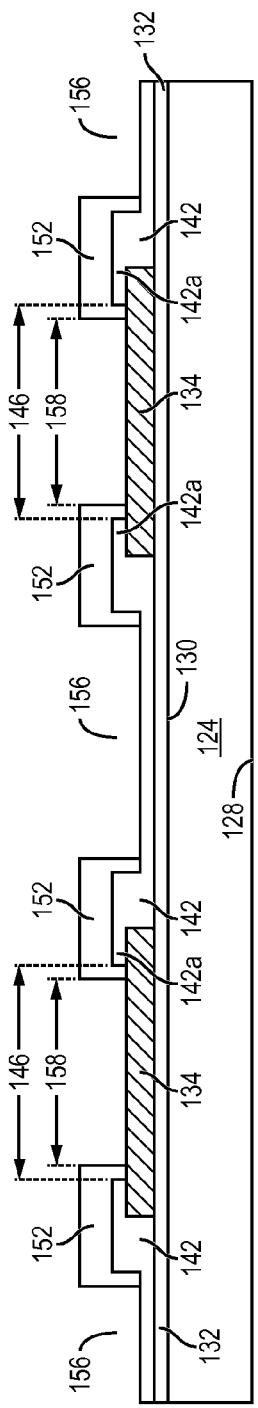

FIGS. 4a-4g illustrate, in relation to FIGS. 1, 2a-2b and 3a-3c, a process of forming a conductive joint structure over a semiconductor die. In FIG. 4a, an insulating or passivation layer 142 is formed over insulating layer 132 and conductive layer 134 using PVD, CVD, printing, spin coating, spray coating, sintering or thermal oxidation. The insulating layer 142 contains one or more layers of SiO2, Si3N4, SiON, Ta2O5, Al2O3, HfO2, BCB, PI, PBO, or other suitable insulating material. In some embodiments, insulating layer 142 includes a passivation layer.

In FIG. 4b, a portion of insulating layer 142 is removed by an etching process or laser direct ablation (LDA) to form vias or openings 146 over contact pads 134 and vias or openings 148 adjacent to vias 146. Vias 146 have a width W1 and expose a portion of contact pads 134. The formation of vias 148 and vias 146 results in a raised or stepped region 142a of insulating layer 142 that extends over contact pads 134. Region 142a of insulating layer 142 overlaps a perimeter of contact pads 134.

In FIG. 4c, an insulating or passivation layer 152 is formed over active surface 130 of semiconductor die 124 using PVD, CVD, printing, spin coating, spray coating, sintering or thermal oxidation. The insulating layer 152 contains one or more layers of SiO2, Si3N4, SiON, Ta2O5, Al2O3, HfO2, BCB, PI, PBO, or other suitable insulating material. Insulating layer 152 covers semiconductor die 124 and fills vias 146 and 148. In some embodiments, insulating layer 152 operates as a polyimide stress relief buffer layer.

In FIG. 4d, a portion of insulating layer 152 is removed by an etching process or LDA to form vias or openings 158 over contact pads 134 and over vias 146, and to form vias or openings 156 adjacent to vias 158. Vias 158 have a width W2 and expose a portion of contact pads 134. The formation of vias 158 and vias 156 results in a portion of insulating layer 152 disposed over a perimeter of contact pads 134. As further shown in FIG. 4d, insulating layer 152 surrounds and covers region 142a of insulating layer 142. Insulating layer 152 extends over sides surfaces of region 142a of insulating layer 142. A portion of insulating layer 152 extends over region 142a of insulating layer 142 and contacts a surface of contact pads 134 through vias 146. Insulating layer 152, depicted in a cross section such as FIG. 4d, overlays region 142a of insulating layer 142 as an inverted U-shape over region 142a of insulating layer 142.

Width W1 of vias 146 is greater than width W2 of vias 158, i.e., width W2 of vias 158 is smaller than width W1 of vias 146. Vias 158 of insulating layer 152 expose an area of contact pads 134 less than the area of contact pads 134 exposed by vias 146 of insulating layer 142. Insulating layer 152 overlaps the region 142a of insulating layer 142 extending over the surface of contact pads 134 to reduce the exposed surface of contact pads 134. In some embodiments, insulating layer 152 includes a polyimide cylindrical region over insulating layer 142 and contact pads 134 as a stress reducing conductive joint component.

Figure 4E:
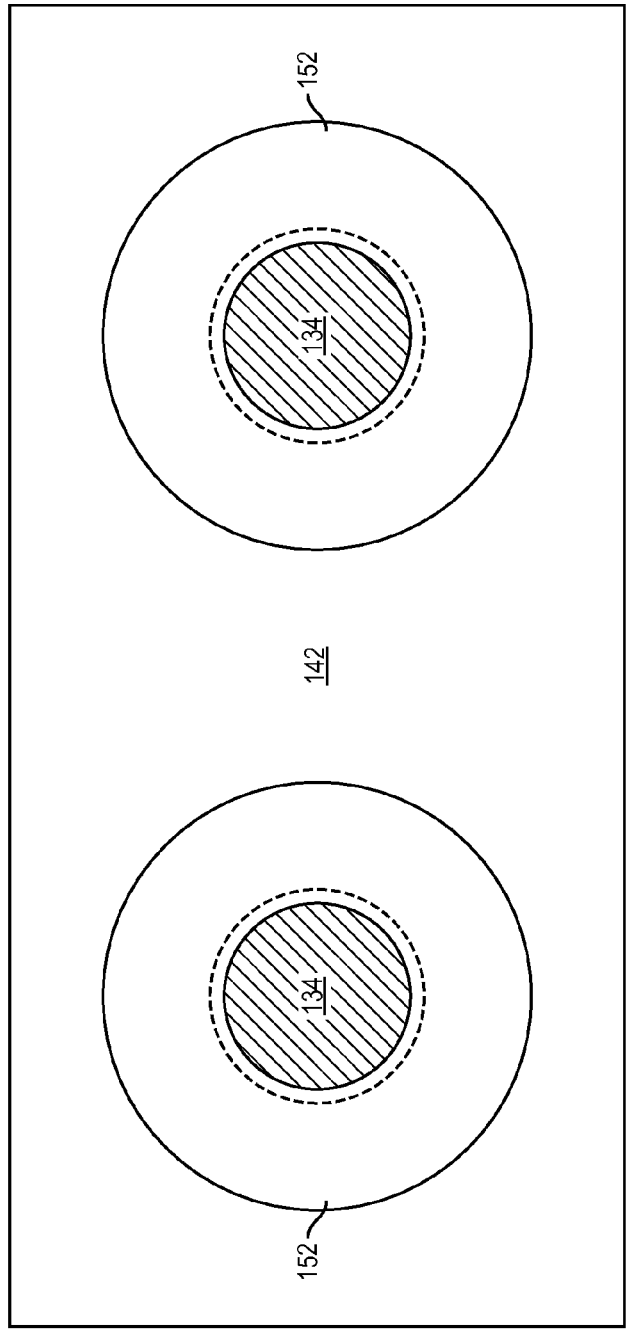

FIG. 4e shows a plan view of the structure described in FIG. 4d with insulating layer 152 disposed over insulating layer 142 and contact pads 134.

In FIG. 4f, an electrically conductive layer 162 is formed over insulating layer 152 and contact pads 134 using PVD, CVD, electrolytic plating, electroless plating, or other suitable metal deposition process. Conductive layer 162 contains one or more layers of Al, Cu, Sn, Ni, Au, Ag, or other suitable electrically conductive material. A portion of conductive layer 162 is electrically connected to contact pads 134 of semiconductor die 124 through vias 146 and vias 158. In some embodiments, conductive layer 162 is conformally applied to and follows the contours of insulating layer 152, vias 146, and vias 158. In one embodiment, conductive layer 162 includes an under bump metallization (UBM) layer formed over a surface of insulating layer 152 having a wetting layer, barrier layer, and adhesive layer. As shown in FIG. 4f, conductive layer 162 terminates before reaching an edge of insulating layer 152 such that a portion of insulating layer 152 is exposed from conductive layer 162 at the edge of insulating layer 152. In some embodiments, conductive layer 162 is disposed within a footprint of insulating layer 152.

In FIG. 4g, an electrically conductive layer 164 is formed over conductive layer 162 using PVD, CVD, electrolytic plating, electroless plating, or other suitable metal deposition process. Conductive layer 164 contains one or more layers of Al, Cu, Sn, Ni, Au, Ag, or other suitable electrically conductive material. A portion of conductive layer 164 is electrically connected to contact pads 134 of semiconductor die 124 through conductive layer 162. In some embodiments, conductive layer 164 is conformally applied to and follows the contours of conductive layer 162. In one embodiment, conductive layer 164 operates as an inter-metallic compound (IMC) layer.

An electrically conductive bump material is deposited over contact pads 134, conductive layer 162, and conductive layer 164 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 164 over contact pads 134 using a suitable attachment or bonding process. In one embodiment, the bump material is reflowed by heating the material above its melting point to form balls or bumps 168. In some applications, bumps 168 are reflowed a second time to improve electrical contact to conductive layer 164. Bumps 168 can also be compression bonded to conductive layer 164. Bumps 168 represent one type of interconnect structure that can be formed over contact pads 134. The interconnect structure can also use stud bump, micro bump, or other electrical interconnect. A first portion of bumps 168 extends into vias 146 and 158 and is recessed below a second portion of bumps 168 disposed over the first portion of bumps 168.

FIG. 4g shows a stress-reduced conductive joint structure 172. Conductive joint structure 172 can be formed at the wafer level as depicted in FIGS. 4a-4g. Alternatively, conductive joint structure 172 can be formed after singulation of individual semiconductor die 124 from wafer 120.

Insulating layer 152 is disposed over region 142a of insulating layer 142. Vias 158 of insulating layer 152 partially expose contact pads 134. Width W1 of vias 146 is greater than width W2 of vias 158, i.e., width W2 of vias 158 is smaller than width W1 of vias 146. Insulating layer 152 overlaps region 142a of insulating layer 142 with a portion of insulating layer 152 extending over the surface of contact pads 134 to reduce the exposed surface of contact pads 134. Insulating layer 152 can be formed as a ring or cylindrical region over a portion of contact pads 134 and insulating layer 142. Conductive layer 162 and conductive layer 164 are formed on insulating layer 152 over contact pads 134. Insulating layer 152 covers region 142a of insulating layer 142.

Conductive joint structure 172 provides a unique and improved shape, size, and location for insulating layer 152 as compared to existing conductive joint structures. Insulating layer 152 operates as a stress relief buffer formed on insulating layer 142 and over a perimeter of contact pads 134 as a cylindered region or ring. Insulating layer 152 is a departure from standard conductive joint structures which employ a flat continuous insulating layer across the entire surface of a passivation layer because portions of insulating layer 142 are exposed from insulating layer 152. Insulating layer 152 is formed at predetermined locations over contact pads 134. Insulating layer 152 includes an opening 158 with a width W2 smaller than width W1 of opening 146 in insulating layer 142 which is different from POU structures. Unlike POU structures, the UBM layer, i.e., conductive layer 162, is formed over insulating layer 152.

Insulating layer 152 has a reduced homogenous profile over semiconductor die 124. Insulating layer 152 does not completely cover semiconductor die 124 and insulating layer 152 includes vias 156 over insulating layer 142 which contribute to a reduction in the total homogenous area or volume of insulating layer 152 over semiconductor die 124. Build-up of stress within insulating layer 152 is minimized because stress imposed upon or absorbed by insulating layer 152 can travel a shorter distance across the reduced area of insulating layer 152 and dissipate more efficiently outside insulating layer 152. Stress can, for example, dissipate through vias 156. Consequently, the structural stability of insulating layer 152 is improved and the probability of crack formation or other structural defects in insulating layer 152 is decreased.

Further, with conductive joint structure 172, conductive layer 162, as a UBM, is disposed over insulating layer 152 which provides additional stress relief for conductive layer 162 and surrounding components. Conductive joint structure 172, with conductive layer 162 over insulating layer 152, provides an increase in the contact area or interface between insulating layer 152 and conductive layer 162. The increased contact area between insulating layer 152 and conductive layer 162 allows insulating layer 152 to absorb a greater amount of stress imposed on conductive layer 162. Unlike POU structures, conductive joint structure 172 decreases the physical connection between contact pads 134 and conductive layers 162 and 164. By reducing the metal-to-metal connection between conductive layers 162 and 164 and contact pads 134 while increasing the interface between conductive layers 162 and 164 and insulating layer 152, stress is minimized along conductive layers 162 and 164. As an additional advantage over POU structures, insulating layer 152 makes physical contact with contact pads 134 which allows insulating layer to absorb stress imposed on contact pads 134. Conductive joint structure 172 optimizes the placement and design of insulating layer 152 to make maximum benefit of the structural qualities of insulating layer 152 as a stress relief buffer.

Conductive joint structure 172 provides enhanced stress relief to minimize the totality of different stress-related issues. Conductive joint structure 172 is not limited to minimization of particular forms of conductive joint stress. Conductive joint structure 172 provides a combination of stress relief benefits and can minimize, e.g., UBM stress, ELK stress, bump stress, and stress imposed on intermetallic compound layers such as conductive layer 164. For example, insulating layer 152 minimizes stress for ELK layers, i.e., insulating layer 132, and reduces frequency of ELK cracking. Insulating layer 152 minimizes stress for insulating layer 142 by redistributing the stress profile to reduce cracking of insulating layer 142 over conductive layer 134. Insulating layer minimizes stress imposed on UBM layers such as conductive layers 162 and IMC layers such as conductive layer 164. Insulating layer 152 minimizes stress for bumps 168 by redistributing the stress profile to reduce cracking and other interconnect defects. Conductive joint structure 172 provides multifaceted stress relief to minimize the totality of stress issues imposed on conductive joint structure 172.

Under simulated test conditions, conductive joint structure 172, when compared to standard conductive joint structures, reduces stress imposed on an ELK layer by at least 9%, stress imposed on UBM layers by at least 18%, and stress imposed on IMC layers by at least 7%. Under the same conditions, when measuring stress imposed upon ELK layers, UBM layers, and IMC layers, conductive joint structure 172 outperforms POU structures, especially with respect to stress imposed on IMC layers. Furthermore, when compared to conventional manufacturing methods, conductive joint structure 172 does not require additional process steps and involves little to no additional cost.

Figure 5C:
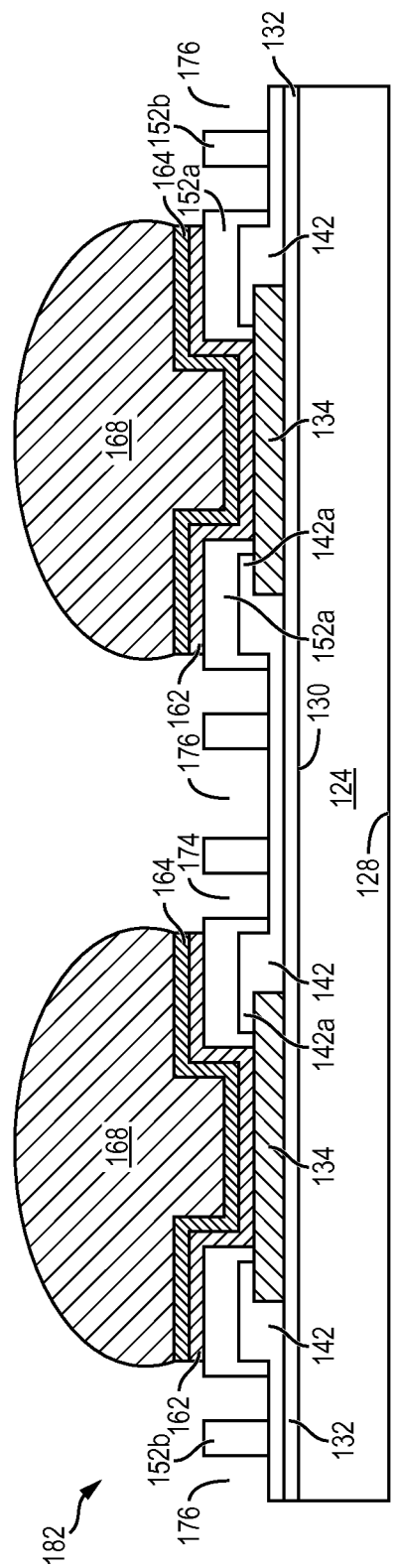

FIGS. 5a-5c illustrate another embodiment of a conductive joint structure formed over a semiconductor die using a process similar to FIGS. 4a-4g. FIG. 5a shows a variation of the step described in FIG. 4d. Continuing from FIG. 4c, a portion of insulating layer 152 from FIG. 4c is removed by an etching process or LDA to form vias or openings 158, vias or openings 174, and vias or openings 176.

In FIG. 5a, after the formation of vias 158, 174, and 176, insulating layer 152 is divided into first and second separate and isolated cylindrical regions disposed over insulating layer 142. First region 152a of insulating layer 152 completely covers region 142a of insulating layer 142. First region 152a of insulating layer 152 overlaps region 142a of insulating layer 142 on the surface of contact pads 134. Second region 152b of insulating layer 152 is disposed on a surface of insulating layer 142 around first region 152a as depicted in FIG. 5b. In some embodiments, region 152b of insulating layer 152 completely surrounds first region 152a. In some embodiments, second region 152b of insulating layer 152 has a concentric geometric relationship with respect to first region 152a of insulating layer 152 with second region 152b extending parallel to and around a perimeter of first region 152a. In one embodiment, insulating layer 152 includes a polyimide layer comprising one or more cylindrical regions over insulating layer 142. Alternatively, instead of modifying insulating layer 152 to show second region 152b of insulating layer 152, an additional insulating layer similar to insulating layer 152 may be formed over the structure in FIG. 4d to arrive at the structure shown in FIG. 5a.

Vias 158 have a width W2 and partially expose contact pads 134. The formation of vias 158, vias 174, and vias 176 results in first region 152a of insulating layer 152 overlapping a perimeter of contact pads 134. Width W1 of vias 146 is greater than width W2 of vias 158, i.e., width W2 of vias 158 is smaller than width W1 of vias 146. Vias 158 of insulating layer 152 expose an area of contact pads 134 less than the area of contact pads 134 exposed by vias 146 of insulating layer 142. As shown in FIG. 5b, vias 174 separate first region 152a and second region 152b of insulating layer 152 and expose insulating layer 142 around a perimeter of first region 152a of insulating layer 152. Vias 176 expose insulating layer 142 around a perimeter of second region 152b of insulating layer 152 such that second region 152b terminates before reaching an edge of the semiconductor die 124.

FIG. 5c shows conductive joint structure 182 with insulating layer 152 as described in FIGS. 5a-5b after the formation of conductive layers 162 and 164 and after the formation of bumps 168 using a process similar to FIGS. 4f-4g. Conductive joint structure 182 can be formed at the wafer level using a process similar to FIGS. 4a-4g and FIGS. 5a-5b. Alternatively, conductive joint structure 182 can be formed after singulation of individual semiconductor die 124 from wafer 120.

Conductive joint structure 182 provides a unique and improved shape, size, and location for insulating layer 152 as compared to existing conductive joint structures. Insulating layer 152 operates as a stress relief buffer formed on insulating layer 142 and over a perimeter of contact pads 134 as a cylindered structure or ring. A portion of insulating layer 142 is exposed from insulating layer 152. Insulating layer 152 is a departure from standard conductive joint structures which employ a flat continuous insulating layer across the entire surface of a passivation layer because portions of insulating layer 142 are exposed from insulating layer 152. Insulating layer 152 is formed at predetermined locations over insulating layer 142. Insulating layer 152 includes an opening 158 with a width W2 smaller than width W1 of opening 146 in insulating layer 142 which is different from POU structures. Unlike POU structures, the UBM layer, i.e., conductive layer 162, is formed over insulating layer 152.

Insulating layer 152 has a reduced homogenous profile over semiconductor die 124. Insulating layer 152 does not completely cover semiconductor die 124 and insulating layer 152 includes openings 174 and 176 over insulating layer 142 which contribute to a reduction in the total homogenous area or volume of insulating layer 152 over semiconductor die 124. Build-up of stress within insulating layer 152 is minimized because stress imposed upon or absorbed by insulating layer 152 can travel a shorter distance across the reduced area of insulating layer 152 and dissipate more efficiently outside insulating layer 152. Stress can, for example, dissipate through vias 174 or 176. Consequently, the structural stability of insulating layer 152 is improved and the probability of crack formation or other structural defects in insulating layer 152 is decreased.

Further, with conductive joint structure 182, conductive layer 162, as a UBM, is disposed over insulating layer 152 which provides additional stress relief for conductive layer 162 and surrounding components. Conductive joint structure 182, with conductive layer 162 over insulating layer 152, provides an increase in the contact area or interface between insulating layer 152 and conductive layer 162. The increased contact area between insulating layer 152 and conductive layer 162 allows insulating layer 152 to absorb a greater amount of stress imposed on conductive layer 162. Unlike POU structures, conductive joint structure 182 decreases the physical connection between contact pads 134 and conductive layers 162 and 164. By reducing the metal-to-metal connection between conductive layers 162 and 164 and contact pads 134 while increasing the interface between conductive layers 162 and 164 and insulating layer 152, stress is minimized along conductive layers 162 and 164. As an additional advantage over POU structures, insulating layer 152 makes physical contact with contact pads 134 which allows insulating layer to absorb stress imposed on contact pads 134. Conductive joint structure 182 optimizes the placement and design of insulating layer 152 to make maximum benefit of the structural qualities of insulating layer 152 as a stress relief buffer.

Conductive joint structure 182 provides enhanced stress relief to minimize the totality of different stress-related issues. Conductive joint structure 182 is not limited to minimization of particular forms of stress. Conductive joint structure 182 provides a combination of stress relief benefits and can minimize, e.g., UBM stress, ELK stress, bump stress, and stress imposed on intermetallic compound layers such as conductive layer 164. For example, insulating layer 152 minimizes stress with ELK layers, i.e., insulating layer 132, and reduces frequency of ELK cracking. Insulating layer 152 minimizes stress for insulating layer 142 by redistributing the stress profile to reduce cracking of insulating layer 142 over conductive layer 134. Insulating layer 152 minimizes stress imposed on UBM layers such as conductive layers 162 and IMC layers such as conductive layer 164. Insulating layer 152 minimizes stress for bumps 168 by redistributing the stress profile to reduce cracking and other interconnect defects. Conductive joint structure 182 provides multifaceted stress relief.

Second region 152b, combined with first region 152a, increases the total area of insulating layer 152 disposed over insulating layer 142. Consequently, insulating layer 152, as a stress relief buffer, is expanded to provide maximum stress relief coverage across conductive joint structure 182. Vias 174 and 176 provide a break within insulating layer 152 for stress dissipation and structural reliability.

Under simulated test conditions, conductive joint structure 182, when compared to standard conductive joint structures, reduces stress imposed on an ELK layer by at least 7%, stress imposed on UBM layers by at least 14%, and stress imposed on IMC layers by at least 5%. Under the same conditions, when measuring stress imposed upon ELK layers, UBM layers, and IMC layers, conductive joint structure 182 outperforms POU structures, especially with respect to stress imposed on IMC layers. Furthermore, when compared to conventional manufacturing methods, conductive joint structure 182 does not require additional process steps and involves little to no additional cost.

Figure 6C:
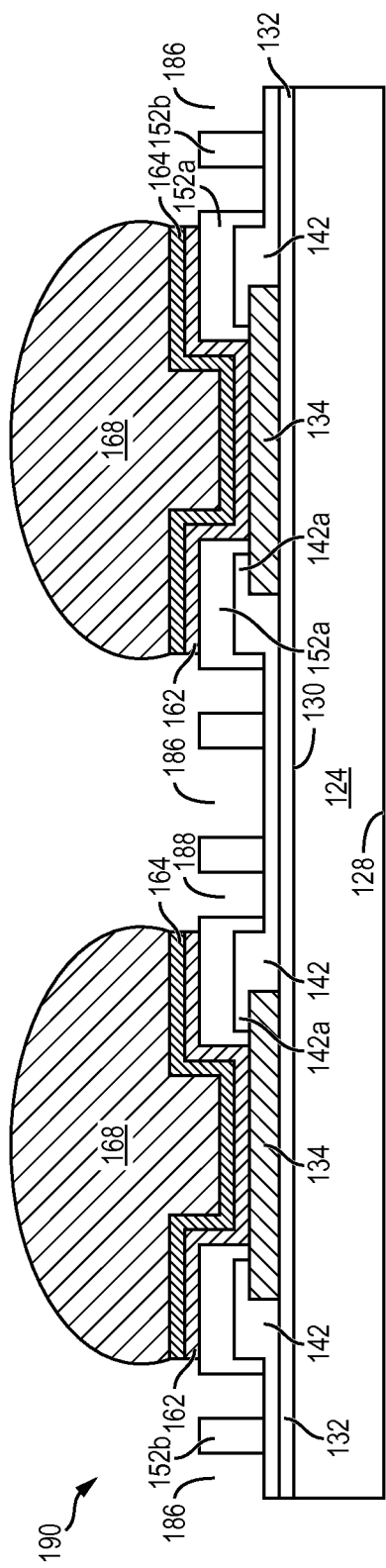

FIGS. 6a-6c illustrate another embodiment of a conductive joint structure formed over a semiconductor die using a process similar to FIGS. 4a-4g. FIG. 6a shows a variation of the step described in FIG. 4d. Continuing from FIG. 4c, a portion of insulating layer 152 from FIG. 4c is removed by an etching process or LDA to form vias or openings 158, vias or openings 188, and vias or openings 186.

In FIG. 6a, after the formation of vias 158, 188, and 186, insulating layer 152 is divided into first and second cylindrical regions disposed over insulating layer 142. First region 152a of insulating layer 152 completely covers region 142a of insulating layer 142. First region 152a of insulating layer 152 overlaps region 142a of insulating layer 142 on the surface of contact pads 134. Second region 152b of insulating layer 152 is disposed on a surface of insulating layer 142 around first region 152a as depicted in FIG. 6b. In some embodiments, region 152b of insulating layer 152 completely surrounds first region 152a. In some embodiments, second region 152b of insulating layer 152 has a concentric geometric relationship with respect to first region 152a of insulating layer 152 with second region 152b extending parallel to a perimeter of first region 152a.

In one embodiment, insulating layer 152 includes a polyimide layer comprising one or more cylindrical regions over insulating layer 142. Alternatively, instead of modifying insulating layer 152 to show second region 152b of insulating layer 152, an additional insulating layer similar to insulating layer 152 may be formed over the structure in FIG. 4d to arrive at the structure shown in FIG. 6a.

Vias 158 have a width W2 and partially expose contact pads 134. The formation of vias 158, vias 188, and vias 186 results in first region 152a of insulating layer 152 overlapping a perimeter of contact pads 134. Width W1 of vias 146 is greater than width W2 of vias 158, i.e., width W2 of vias 158 is smaller than width W1 of vias 146. Vias 158 of insulating layer 152 expose an area of contact pads 134 less than the area of contact pads 134 exposed by vias 146 of insulating layer 142.

As further shown in FIG. 6b, vias 188 comprise slots, or channels to expose portions of insulating layer 142 between first region 152a and second region 152b of insulating layer 152. Due to the shape of vias 188, insulating layer 152 includes bridges or cross-bars which connect first region 152a and second region 152b between vias 188. Vias 186 expose insulating layer 142 around a perimeter of second region 152b of insulating layer 152 such that second region 152b terminates before reaching an edge of the semiconductor die 124.

FIG. 6c shows conductive joint structure 190 with insulating layer 152 as described in FIGS. 6a-6b after the formation of conductive layers 162 and 164 and after the formation of bumps 168 using a process similar to FIGS. 4f-4g. Conductive joint structure 190 can be formed at the wafer level using a process similar to FIGS. 4a-4g and FIGS. 6a-6b. Alternatively, conductive joint structure 190 can be formed after singulation of individual semiconductor die 124 from wafer 120.

Conductive joint structure 190 provides a unique and improved shape, size, and location for insulating layer 152 as compared to existing conductive joint structures. Insulating layer 152 operates as a stress relief buffer formed on insulating layer 142 and over a perimeter of contact pads 134 as a cylindered structure or ring. Insulating layer 152 is a departure from standard conductive joint structures which employ a flat continuous insulating layer across the entire surface of a passivation layer because portions of insulating layer 142 are exposed from insulating layer 152. Insulating layer 152 is formed at predetermined locations around contact pads 134. Insulating layer 152 includes an opening 158 with a width W2 smaller than the width W1 of opening 146 in insulating layer 142 which is different from POU structures. Unlike POU structures, the UBM layer, i.e., conductive layer 162, is formed over insulating layer 152.

Insulating layer 152 has a reduced homogenous profile over semiconductor die 124. Insulating layer 152 does not completely cover semiconductor die 124 and insulating layer 152 includes vias 186 and 188 over insulating layer 142 which contribute to a reduction in the total homogenous area or volume of insulating layer 152 over semiconductor die 124. Build-up of stress within insulating layer 152 is minimized because stress imposed upon or absorbed by insulating layer 152 can travel a shorter distance across the reduced area of insulating layer 152 and dissipate more efficiently outside insulating layer 152. Stress can, for example, dissipate through vias 188 or 186. Consequently, the structural stability of insulating layer 152 is improved and the probability of crack formation or other structural defects in insulating layer 152 is decreased.

Further, with conductive joint structure 190, conductive layer 162, as a UBM, is disposed over insulating layer 152 which provides additional stress relief for conductive layer 162 and surrounding components. Conductive joint structure 190, with conductive layer 162 over insulating layer 152, provides an increase in the contact area or interface between insulating layer 152 and conductive layer 162. The increased contact area between insulating layer 152 and conductive layer 162 allows insulating layer 152 to absorb a greater amount of stress imposed on conductive layer 162. Unlike POU structures, conductive joint structure 190 decreases the physical connection between contact pads 134 and conductive layers 162 and 164. By reducing the metal-to-metal connection between conductive layers 162 and 164 and contact pads 134 while increasing the interface between conductive layers 162 and 164 and insulating layer 152, stress is minimized along conductive layers 162 and 164. As an additional advantage over POU structures, insulating layer 152 makes physical contact with contact pads 134 which allows insulating layer to absorb stress imposed on contact pads 134. Conductive joint structure 190 optimizes the placement and design of insulating layer 152 to make maximum benefit of the structural qualities of insulating layer 152 as a stress relief buffer.

Conductive joint structure 190 provides enhanced stress relief to minimize the totality of different stress-related issues. Conductive joint structure 190 is not limited to minimization of particular forms of stress. Conductive joint structure 190 provides a combination of stress relief benefits and can minimize, e.g., UBM stress, ELK stress, bump stress, and stress imposed on intermetallic compound layers such as conductive layer 164. For example, insulating layer 152 minimizes stress for ELK layers, i.e., insulating layer 132, and reduces frequency of ELK cracking. Insulating layer 152 minimizes stress for insulating layer 142 by redistributing the stress profile to reduce cracking of insulating layer 142 over conductive layer 134. Insulating layer 152 minimizes stress imposed on UBM layers such as conductive layers 162 and IMC layers such as conductive layer 164. Insulating layer 152 minimizes stress for bumps 168 by redistributing the stress profile to reduce cracking and other interconnect defects.

Conductive joint structure 190 provides multifaceted stress relief.

Second region 152b, combined with first region 152a, increases the total area of insulating layer 152 disposed over insulating layer 142. Consequently, insulating layer 152, as a stress relief buffer, is expanded to provide maximum stress relief coverage across conductive joint structure 190. Vias 188 and 186 provide breaks within insulating layer 152 for stress dissipation and structural reliability.

Under simulated conditions, conductive joint structure 190, when compared to standard conductive joint structures, reduces stress imposed on an ELK layer by at least 7%, stress imposed on UBM layers by at least 14%, and stress imposed on IMC layers by at least 5%. Under the same conditions, when measuring stress imposed upon ELK layers, UBM layers, and IMC layers, conductive joint structure 190 outperforms POU structures, especially with respect to stress imposed on IMC layers. Furthermore, when compared to conventional manufacturing methods, conductive joint structure 190 does not require additional process steps and involves little to no additional cost.

Figure 7A:
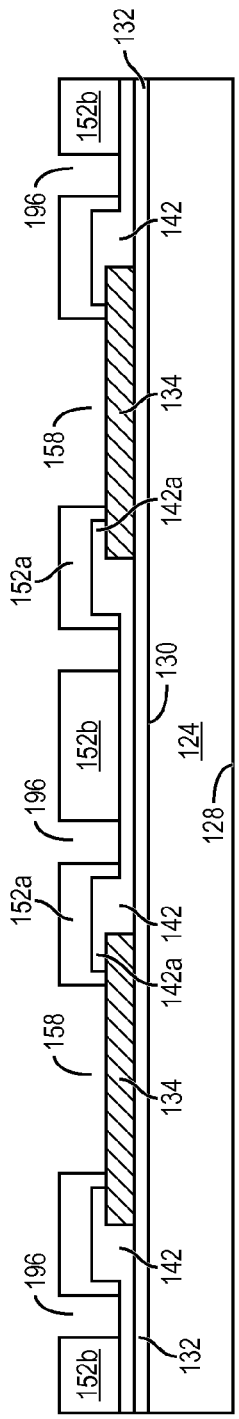
FIGS. 7a-7c illustrate another embodiment of a conductive joint structure formed over a semiconductor die using a process similar to FIGS. 4a-4g.
Figure 7B:
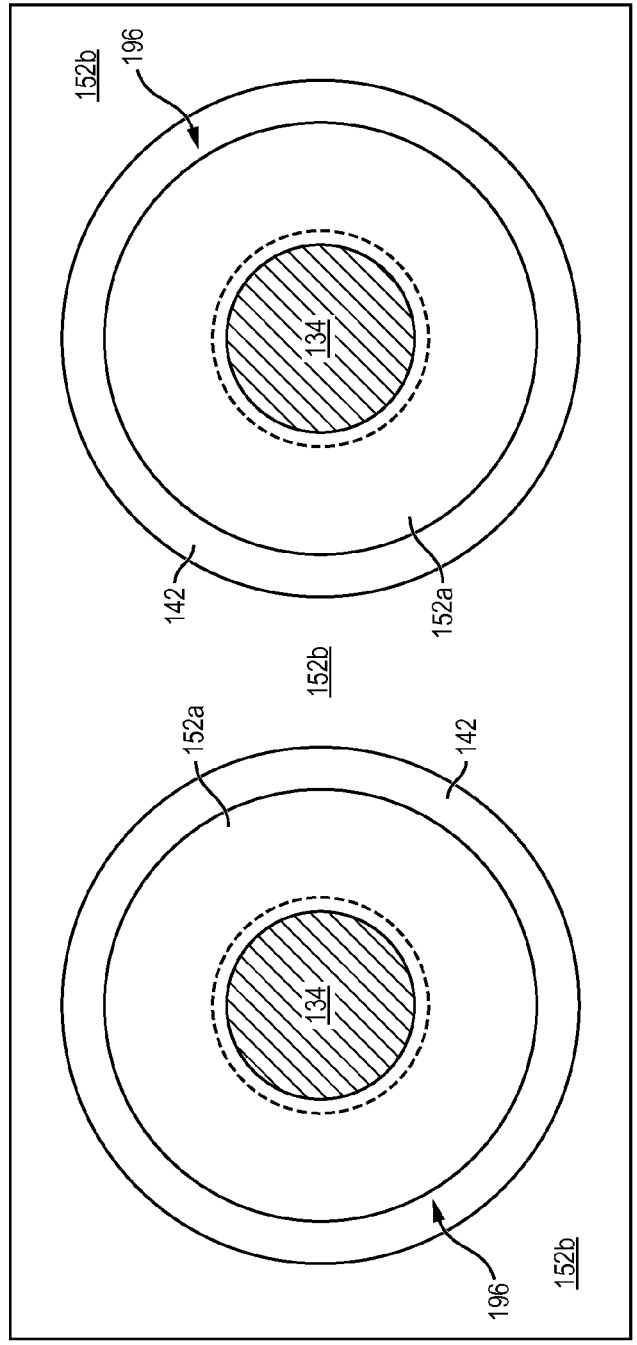
Figure 7C:
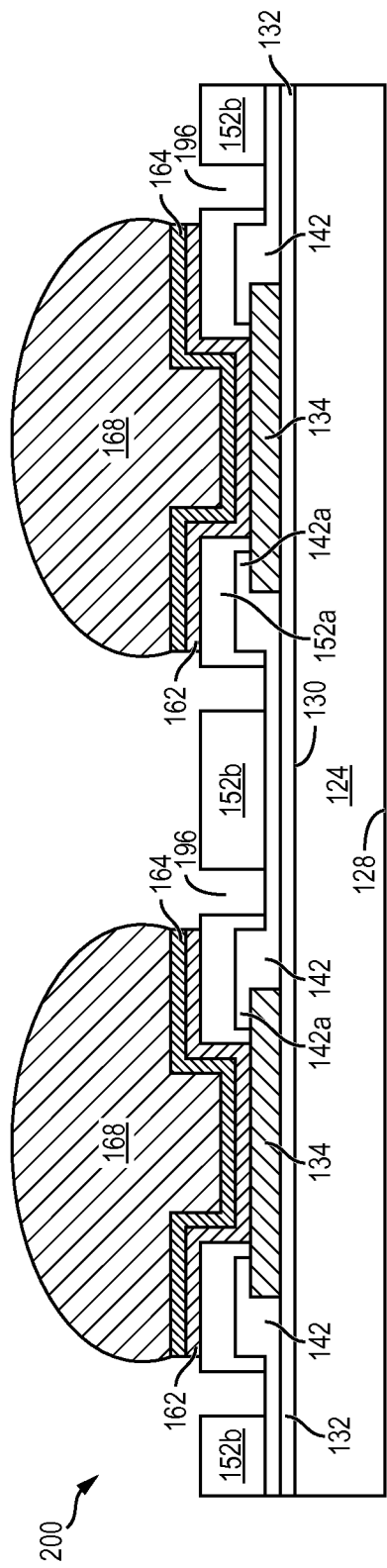

FIGS. 7a-7c illustrate another embodiment of a conductive joint structure formed over a semiconductor die using a process similar to FIGS. 4a-4g. FIG. 7a shows a variation of the step described in FIG. 4d. Continuing from FIG. 4c, a portion of insulating layer 152 from FIG. 4c is removed by an etching process or LDA to form vias or openings 158 and vias or openings 196.

In FIG. 7a, after the formation of vias 158 and 196, insulating layer 152 is divided into first and second separate and isolated regions disposed over insulating layer 142. First region 152a of insulating layer 152 completely covers region 142a of insulating layer 142. First region 152a of insulating layer 152 overlaps region 142a of insulating layer 142 on the surface of contact pads 134. Second region 152b of insulating layer 152 is disposed on a surface of insulating layer 142 around first region 152a as depicted in FIG. 7b. In some embodiments, region 152b of insulating layer 152 completely surrounds first region 152a. In some embodiments, second region 152b of insulating layer 152 has a concentric geometric relationship with respect to first region 152a of insulating layer 152. In one embodiment, second region 152b extends to an edge of semiconductor die 124.

In one embodiment, insulating layer 152 includes a polyimide layer comprising one or more cylindrical regions over insulating layer 142. Alternatively, instead of modifying insulating layer 152 to show second region 152b of insulating layer 152, an additional insulating layer similar to insulating layer 152 may be formed over the structure in FIG. 4d to arrive at the structure shown in FIG. 7a.

Vias 158 have a width W2 and partially expose contact pads 134. The formation of vias 158 and vias 196 results in first region 152a of insulating layer 152 overlapping a perimeter of contact pads 134. Width W1 of vias 146 is greater than width W2 of vias 158, i.e., width W2 of vias 158 is smaller than width W1 of vias 146. Vias 158 of insulating layer 152 expose an area of contact pads 134 less than the area of contact pads 134 exposed by vias 146 of insulating layer 142. As shown in FIG. 7b, vias 196 separate first region 152a and second region 152b of insulating layer 152 and expose insulating layer 142 around a perimeter of first region 152a of insulating layer 152.

FIG. 7c shows conductive joint structure 200 with insulating layer 152 as described in FIGS. 7a-7b after the formation of conductive layers 162 and 164 and after the formation of bumps 168 using a process similar to FIGS. 4f-4g. Conductive joint structure 200 can be formed at the wafer level using a process similar to FIGS. 4a-4g and FIGS. 7a-7b. Alternatively, conductive joint structure 200 can be formed after singulation of individual semiconductor die 124 from wafer 120.

Conductive joint structure 200 provides a unique and improved shape, size, and location for insulating layer 152 as compared to existing conductive joint structures. Insulating layer 152 operates as a stress relief buffer formed on insulating layer 142 and over a perimeter of contact pads 134 as a cylindered structure or ring. Insulating layer 152 is a departure from standard conductive joint structures which employ a flat continuous insulating layer across the entire surface of a passivation layer because portions of insulating layer 142 are exposed from insulating layer 152. Insulating layer 152 is formed at predetermined locations over contact pads 134. Insulating layer 152 includes an opening 158 with a width W2 smaller than the width W1 of opening 146 in insulating layer 142 which is different from POU structures. Unlike POU structures, the UBM layer, i.e., conductive layer 162, is formed over insulating layer 152.

Insulating layer 152 has a reduced homogenous profile over semiconductor die 124. Insulating layer 152 does not completely cover semiconductor die 124 and insulating layer 152 includes vias 196 over insulating layer 142 which contribute to a reduction in the total homogenous area or volume of insulating layer 152 over semiconductor die 124. Build-up of stress within insulating layer 152 is minimized because stress imposed upon or absorbed by insulating layer 152 can travel a shorter distance across the reduced area of insulating layer 152 and dissipate more efficiently outside insulating layer 152. Stress can, for example, dissipate through vias 196. Consequently, the structural stability of insulating layer 152 is improved and the probability of crack formation or other structural defects in insulating layer 152 is decreased.

Further, with conductive joint structure 200, conductive layer 162, as a UBM, is disposed over insulating layer 152 which provides additional stress relief for conductive layer 162 and surrounding components. Conductive joint structure 200, with conductive layer 162 over insulating layer 152, provides an increase in the contact area or interface between insulating layer 152 and conductive layer 162. The increased contact area between insulating layer 152 and conductive layer 162 allows insulating layer 152 to absorb a greater amount of stress imposed on conductive layer 162. Unlike POU structures, conductive joint structure 200 decreases the physical connection between contact pads 134 and conductive layers 162 and 164. By reducing the metal-to-metal connection between conductive layers 162 and 164 and contact pads 134 while increasing the interface between conductive layers 162 and 164 and insulating layer 152, stress is minimized along conductive layers 162 and 164. As an additional advantage over POU structures, insulating layer 152 makes physical contact with contact pads 134 which allows insulating layer to absorb stress imposed on contact pads 134. Conductive joint structure 200 optimizes the placement and design of insulating layer 152 to make maximum benefit of the structural qualities of insulating layer 152 as a stress relief buffer.

Conductive joint structure 200 provides enhanced stress relief to minimize the totality of different stress-related issues. Conductive joint structure 200 is not limited to minimization of particular forms of stress. Conductive joint structure 200 provides a combination of stress relief benefits and can minimize, e.g., UBM stress, ELK stress, bump stress, and stress imposed on intermetallic compound layers such as conductive layer 164. For example, insulating layer 152 minimizes stress for ELK layers, i.e., insulating layer 132, and reduces frequency of ELK cracking. Insulating layer 152 minimizes stress for insulating layer 142 by redistributing the stress profile to reduce cracking of insulating layer 142 over conductive layer 134. Insulating layer 152 minimizes stress imposed on UBM layers such as conductive layers 162 and IMC layers such as conductive layer 164. Insulating layer 152 minimizes stress for bumps 168 by redistributing the stress profile to reduce cracking and other interconnect defects. Conductive joint structure 200 provides multifaceted stress relief.

Second region 152b, combined with first region 152a, increases the total area of insulating layer 152 disposed over insulating layer 142. Consequently, insulating layer 152, as a stress relief buffer, is expanded to provide maximum stress relief coverage across conductive joint structure 200. Vias 196 provide breaks within insulating layer 152 for stress dissipation and structural reliability.

Under simulated test conditions, conductive joint structure 200, when compared to standard conductive joint structures, reduces stress imposed on an ELK layer by at least 7%, stress imposed on UBM layers by at least 13%, and stress imposed on IMC layers by at least 6%. Under the same conditions, when measuring stress imposed upon ELK layers, UBM layers, and IMC layers, conductive joint structure 200 outperforms POU structures, especially with respect to stress imposed on IMC layers. Furthermore, when compared to conventional manufacturing methods, conductive joint structure 200 does not require additional process steps and involves little to no additional cost.

Figure 8A:
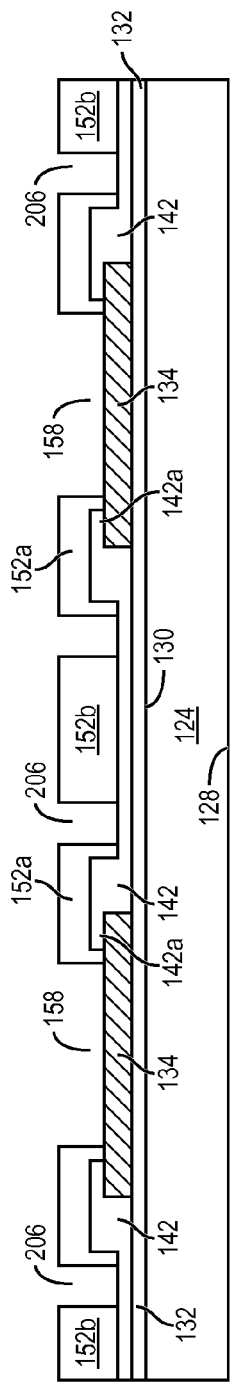
FIGS. 8a-8c illustrate another embodiment of a conductive joint structure formed over a semiconductor die using a process similar to FIGS. 4a-4g.
Figure 8B:
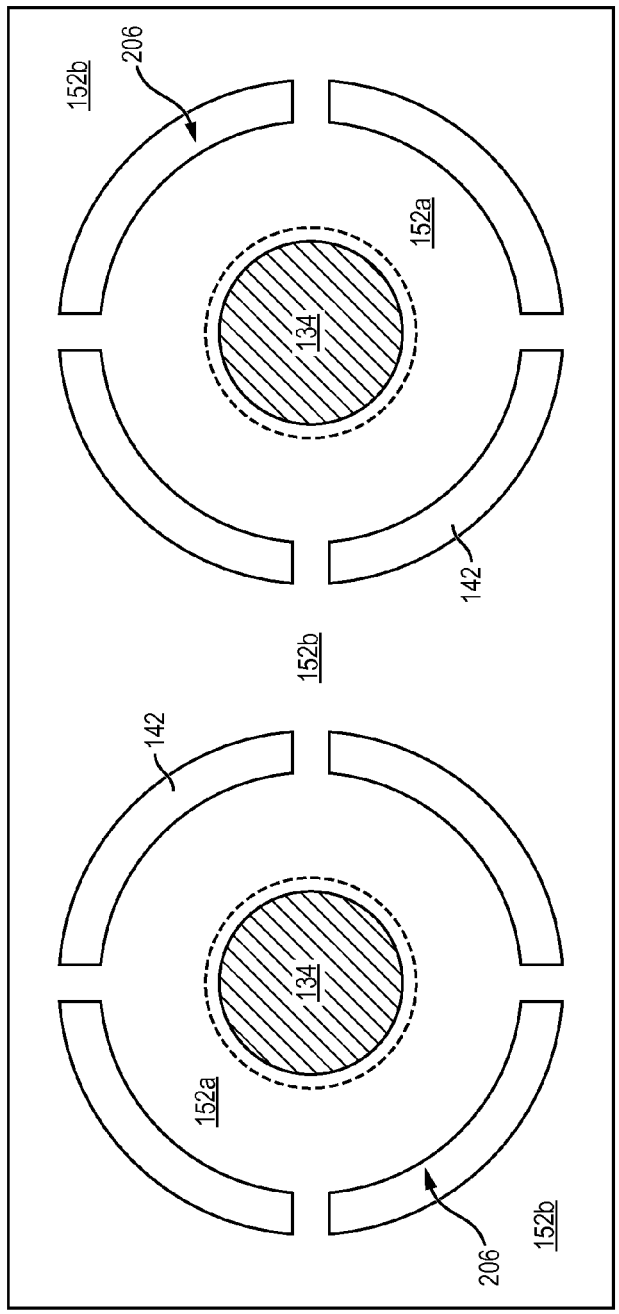
Figure 8C:
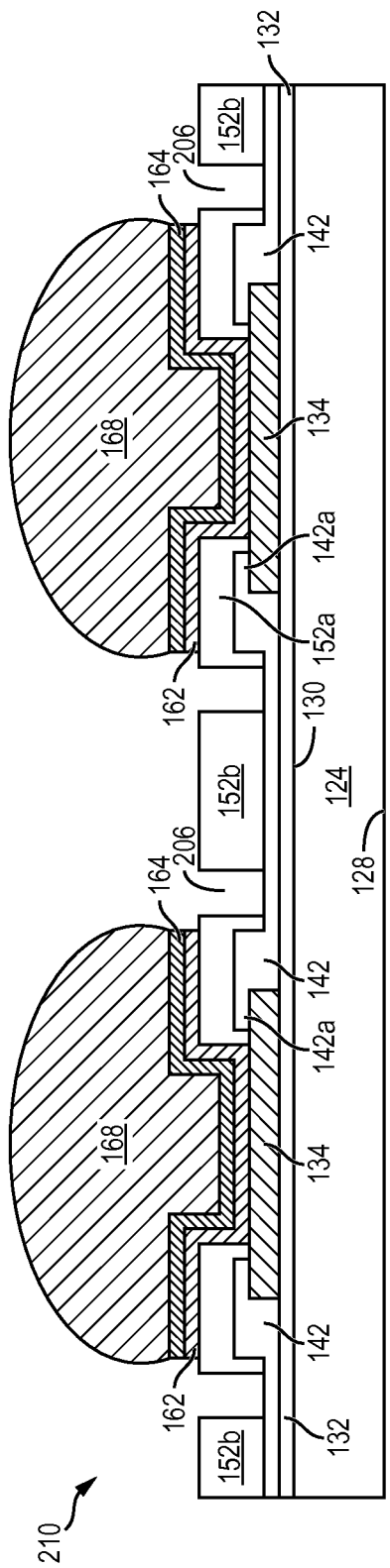

FIGS. 8a-8c illustrate another embodiment of a conductive joint structure formed over a semiconductor die using a process similar to FIGS. 4a-4g. FIG. 8a shows a variation of the step described in FIG. 4d. Continuing from FIG. 4c, a portion of insulating layer 152 from FIG. 4c is removed by an etching process or LDA to form vias or openings 158 and vias or openings 206.

In FIG. 8a, after the formation of vias 158 and 206, insulating layer 152 is divided into first and second regions disposed over insulating layer 142. First region 152a of insulating layer 152 completely covers region 142a of insulating layer 142. First region 152a of insulating layer 152 overlaps region 142a of insulating layer 142 on the surface of contact pads 134. Second region 152b of insulating layer 152 is disposed on a surface of insulating layer 142 around first region 152a as depicted in FIG. 8b. In some embodiments, region 152b of insulating layer 152 completely surrounds first region 152a. In some embodiments, second region 152b of insulating layer 152 has a concentric geometric relationship with respect to first region 152a of insulating layer 152. In one embodiment, second region 152b extends to an edge of semiconductor die 124.

In one embodiment, insulating layer 152 includes a polyimide layer comprising one or more cylindrical regions over insulating layer 142. Alternatively, instead of modifying insulating layer 152 to show second region 152b of insulating layer 152, an additional insulating layer similar to insulating layer 152 may be formed over the structure in FIG. 4d to arrive at the structure shown in FIG. 8a.

Vias 158 have a width W2 and partially expose contact pads 134. The formation of vias 158 and vias 206 results in first region 152a of insulating layer 152 overlapping a perimeter of contact pads 134. Width W1 of vias 146 is greater than width W2 of vias 158, i.e., width W2 of vias 158 is smaller than width W1 of vias 146. Vias 158 of insulating layer 152 expose an area of contact pads 134 less than the area of contact pads 134 exposed by vias 146 of insulating layer 142.

As further shown in FIG. 8b, vias 206 comprise slots, or channels to expose portions of insulating layer 142 between first region 152a and second region 152b of insulating layer 152. Due to the shape of vias 206, insulating layer 152 includes bridges or cross-bars which connect first region 152a and second region 152b between vias 206.

FIG. 8c shows conductive joint structure 210 with insulating layer 152 as described in FIGS. 8a-8b after the formation of conductive layers 162 and 164 and after the formation of bumps 168 using a process similar to FIGS. 4f-4g. Conductive joint structure 210 can be formed at the wafer level using a process similar to FIGS. 4a-4g and FIGS. 8a-8b. Alternatively, conductive joint structure 210 can be formed after singulation of individual semiconductor die 124 from wafer 120.

Conductive joint structure 210 provides a unique and improved shape, size, and location for insulating layer 152 as compared to existing conductive joint structures. Insulating layer 152 operates as a stress relief buffer formed on insulating layer 142 and over a perimeter of contact pads 134 as a cylindered structure or ring. Insulating layer 152 is a departure from standard conductive joint structures which employ a flat continuous insulating layer across the entire surface of a passivation layer because portions of insulating layer 142 are exposed from insulating layer 152. Insulating layer 152 is formed at predetermined locations over insulating layer 142. Insulating layer 152 includes an opening 158 with a width W2 smaller than the width W1 of opening 146 in insulating layer 142 which is different from POU structures. Unlike POU structures, the UBM layer, i.e., conductive layer 162, is formed over insulating layer 152.

Insulating layer 152 has a reduced homogenous profile over semiconductor die 124. Insulating layer 152 does not completely cover semiconductor die 124 and insulating layer 152 includes vias 206 over insulating layer 142 which contribute to a reduction in the total homogenous area or volume of insulating layer 152 over semiconductor die 124. Build-up of stress within insulating layer 152 is minimized because stress imposed upon or absorbed by insulating layer 152 can travel a shorter distance across the reduced area of insulating layer 152 and dissipate more efficiently outside insulating layer 152. Stress can, for example, dissipate through vias 206. Consequently, the structural stability of insulating layer 152 is improved and the probability of crack formation or other structural defects in insulating layer 152 is decreased.

Further, with conductive joint structure 210, conductive layer 162, as a UBM, is disposed over insulating layer 152 which provides additional stress relief for conductive layer 162 and surrounding components. Conductive joint structure 210, with conductive layer 162 over insulating layer 152, provides an increase in the contact area or interface between insulating layer 152 and conductive layer 162. The increased contact area between insulating layer 152 and conductive layer 162 allows insulating layer 152 to absorb a greater amount of stress imposed on conductive layer 162. Unlike POU structures, conductive joint structure 210 decreases the physical connection between contact pads 134 and conductive layers 162 and 164. By reducing the metal-to-metal connection between conductive layers 162 and 164 and contact pads 134 while increasing the interface between conductive layers 162 and 164 and insulating layer 152, stress is minimized along conductive layers 162 and 164. As an additional advantage over POU structures, insulating layer 152 makes physical contact with contact pads 134 which allows insulating layer to absorb stress imposed on contact pads 134. Conductive joint structure 210 optimizes the placement and design of insulating layer 152 to make maximum benefit of the structural qualities of insulating layer 152 as a stress relief buffer.

Conductive joint structure 210 provides enhanced stress relief to minimize the totality of different stress-related issues. Conductive joint structure 210 is not limited to minimization of particular forms of stress. Conductive joint structure 210 provides a combination of stress relief benefits and can minimize, e.g., UBM stress, ELK stress, bump stress, and stress imposed on intermetallic compound layers such as conductive layer 164. For example, insulating layer 152 minimizes stress for ELK layers, i.e., insulating layer 132, and reduces frequency of ELK cracking. Insulating layer 152 minimizes stress for insulating layer 142 by redistributing the stress profile to reduce cracking of insulating layer 142 over conductive layer 134. Insulating layer 152 minimizes stress imposed on UBM layers such as conductive layers 162 and IMC layers such as conductive layer 164. Insulating layer 152 minimizes stress for bumps 168 by redistributing the stress profile to reduce cracking and other interconnect defects. Conductive joint structure 210 provides multifaceted stress relief.

Second region 152b, combined with first region 152a, increases the total area of insulating layer 152 disposed over insulating layer 142. Consequently, insulating layer 152, as a stress relief buffer, is expanded to provide maximum stress relief coverage across conductive joint structure 210. Vias 206 provide a break within insulating layer 152 for stress dissipation and structural reliability.

Under simulated test conditions, conductive joint structure 210, when compared to standard conductive joint structures, reduces stress imposed on an ELK layer by at least 7%, stress imposed on UBM layers by at least 13%, and stress imposed on IMC layers by at least 6%. Under the same conditions, when measuring stress imposed upon ELK layers, UBM layers, and IMC layers, conductive joint structure 210 outperforms POU structures, especially with respect to stress imposed on IMC layers. Furthermore, when compared to conventional manufacturing methods, conductive joint structure 210 does not require additional process steps and involves little to no additional cost.

Figure 9F:
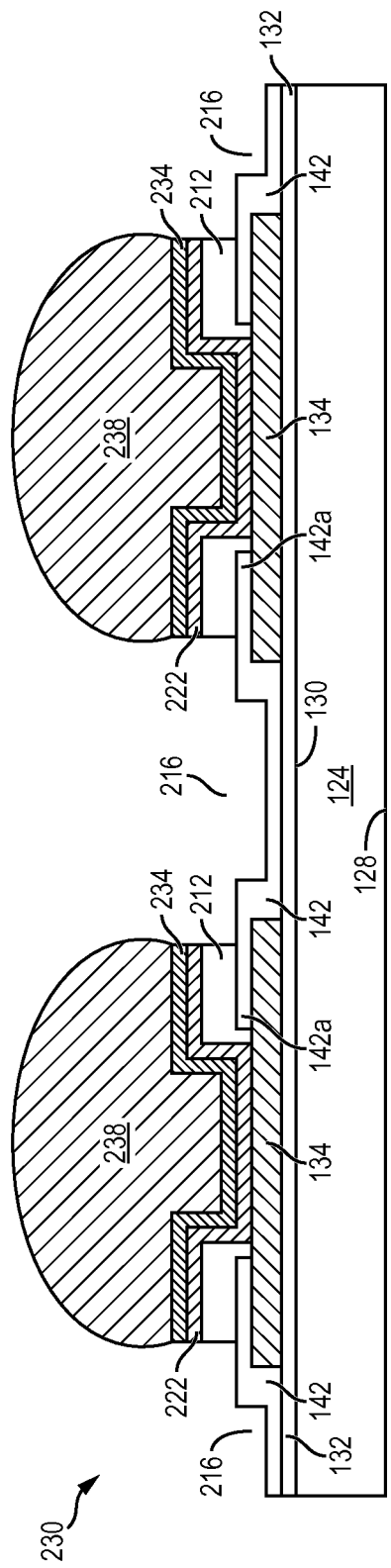

FIGS. 9a-9f, in relation to FIGS. 1, 2a-2b and 3a-3c, illustrate another process of forming a conductive joint structure over a semiconductor die similar to the process illustrated in FIGS. 4a-4g. FIG. 9a shows a semiconductor die 124 with insulating layer 132 formed over active surface 130, contact pads 134 formed over insulating layer 132, and insulating layer 142 formed over contact pads 134 and insulating layer 132 similar to the structure depicted in FIG. 4b. Insulating or passivation layer 142 is formed over insulating layer 132 and conductive layer 134 using PVD, CVD, printing, spin coating, spray coating, sintering or thermal oxidation. The insulating layer 142 contains one or more layers of $SiO_2$, $Si_3N_4$, SiON, $Ta_2O_5$, $Al_2O_3$, $HfO_2$, BCB, PI, PBO, or other suitable insulating material. In some embodiments, insulating layer 142 includes a passivation layer.

A portion of insulating layer 142 is removed by an etching process or LDA to form vias or openings 146 over contact pads 134 and vias or openings 148 adjacent to vias 146. Vias 146 have a width W1 and partially expose contact pads 134. The formation of vias 148 and vias 146 results in a raised or stepped portion 142a of insulating layer 142 that extends over contact pads 134. Region 142a of insulating layer 142 overlaps a perimeter of contact pads 134.

In one embodiment, contact pads 134 of FIG. 9a include a width greater than a width of the contact pads 134 of FIG. 4b and region 142a of insulating layer 142 in FIG. 9a overlaps and covers greater surface area of contact pads 134.

In FIG. 9b, an insulating or passivation layer 212 is formed over insulating layer 142 and active surface 130 of semiconductor die 124 using PVD, CVD, printing, spin coating, spray coating, sintering or thermal oxidation. The insulating layer 212 contains one or more layers of $SiO_2$, $Si_3N_4$, SiON, $Ta_2O_5$, $Al_2O_3$, $HfO_2$, BCB, PI, PBO, or other suitable insulating material. In some embodiments, insulating layer 212 includes a polyimide layer. Insulating layer 212 covers semiconductor die 124 and fills vias 146 and 148.

In FIG. 9c, a portion of insulating layer 212 is removed by an etching process or LDA to form vias or openings 218 over contact pads 134 and over openings 146, and to form vias or openings 216 adjacent to vias 218. Vias 218 have a width W2 and partially expose contact pads 134.

The formation of vias 218 and vias 216 results in insulating layer 212 disposed over a perimeter of contact pads 134 and with insulating layer 212 disposed over a portion of region 142a. Insulating layer 212 extends over a first side surface of region 142a over contact pads 134 while a second side surface of region 142a opposite the first side surface is exposed from insulating layer 212. A portion of insulating layer 212 extends over region 142a of insulating layer 142 and into vias 146 to make direct contact with contact pads 134 and cover additional surface area of contact pads 134. Insulating layer 212, depicted in a cross section such as FIG. 9c, overlays region 142a of insulating layer 142 as an L-shape over region 142a.

Width W1 of vias 146 is greater than width W2 of vias 218, i.e., width W2 of vias 218 is smaller than width W1 of vias 146. Vias 218 of insulating layer 212 expose an area of contact pads 134 less than the area of contact pads 134 exposed by vias 146 of insulating layer 142. After the formation of vias 216 and 218, insulating layer 212 partially covers region 142a of insulating layer 142. Insulating layer 212 overlaps region 142a of insulating layer 142 extending over the surface of contact pads 134 to reduce the exposed surface of contact pads 134. In some embodiments, insulating layer 212 includes a polyimide cylindrical region over insulating layer 142 and operates as a stress reducing conductive joint component.

FIG. 9d shows a plan view of the structure described in FIG. 9c with insulating layer 212 disposed over insulating layer 142 and over contact pads 134. In some embodiments, contact pads 134 extend outside a footprint of insulating layer 212 beneath insulating layer 142.

In FIG. 9e, an electrically conductive layer 222 is formed over insulating layer 212 and contact pads 134 using PVD, CVD, electrolytic plating, electroless plating, or other suitable metal deposition process. Conductive layer 222 contains one or more layers of Al, Cu, Sn, Ni, Au, Ag, or other suitable electrically conductive material. A portion of conductive layer 222 is electrically connected to contact pads 134 of semiconductor die 124 through vias 146 and vias 218. In some embodiments, conductive layer 222 is conformally applied to and follows the contours of insulating layer 212. In one embodiment, conductive layer 222 includes a UBM layer formed over a surface of insulating layer 212 having a wetting layer, barrier layer, and adhesive layer. As shown in FIG. 9e, conductive layer 222 extends to an edge of insulating layer 212 to cover insulating layer 212. In some embodiments, conductive layer 222 is disposed within a footprint of insulating layer 212.

In FIG. 9f, an electrically conductive layer 234 is formed over conductive layer 222 and contact pads 134 using PVD, CVD, electrolytic plating, electroless plating, or other suitable metal deposition process. Conductive layer 234 contains one or more layers of Al, Cu, Sn, Ni, Au, Ag, or other suitable electrically conductive material. A portion of conductive layer 234 is electrically connected to contact pads 134 of semiconductor die 124 through conductive layer 222. In some embodiments, conductive layer 234 is conformally applied to and follows the contours of conductive layer 222. In one embodiment, conductive layer 234 includes an IMC layer.

An electrically conductive bump material is deposited over contact pads 134, conductive layer 222, and conductive layer 234 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 234 over contact pads 134 using a suitable attachment or bonding process. In one embodiment, the bump material is reflowed by heating the material above its melting point to form balls or bumps 238. In some applications, bumps 238 are reflowed a second time to improve electrical contact to conductive layer 234. Bumps 238 can also be compression bonded to conductive layer 234. Bumps 238 represent one type of interconnect structure that can be formed over contact pads 134. The interconnect structure can also use stud bump, micro bump, or other electrical interconnect. A first portion of bumps 238 extends into vias 146 and 218 and is recessed below a second portion of bumps 238 disposed over the first portion of bumps 238.

FIG. 9f shows a stress-reduced conductive joint structure 230. Conductive joint structure 230 can be formed at the wafer level as depicted in FIGS. 9a-9f. Alternatively, conductive joint structure 230 can be formed after singulation of individual semiconductor die 124 from wafer 120.

Insulating layer 212 is disposed over region 142a of insulating layer 142. Vias 218 of insulating layer 212 partially expose contact pads 134. Width W1 of vias 146 is greater than width W2 of vias 218, i.e., width W2 of vias 218 is smaller than width W1 of vias 146. Insulating layer 212 overlaps a portion of region 142a of insulating layer 142 with insulating layer 212 extending over the surface of contact pads 134 to reduce the exposed surface of contact pads 134. Insulating layer 212 can be formed as a ring or cylindrical region over a portion of contact pads 134 and insulating layer 142. Conductive layer 222 and conductive layer 234 are formed over insulating layer 212. Insulating layer 212 partially covers region 142a of insulating layer 142.

Conductive joint structure 230 provides a unique and improved shape, size, and location for insulating layer 212 as compared to existing conductive joint structures. Insulating layer 212 operates as a stress relief buffer formed on insulating layer 142 and over a perimeter of contact pads 134 as a cylindered structure or ring. Insulating layer 212 is a departure from standard conductive joint structures which employ a flat continuous insulating layer across the entire surface of a passivation layer because portions of insulating layer 142 are exposed from insulating layer 212. Insulating layer 212 is formed at predetermined locations over contact pads 134. Insulating layer 212 includes an opening 218 with a width W2 smaller than the width W1 of opening 146 in insulating layer 142 which is different from POU structures. Unlike POU structures, the UBM layer, i.e., conductive layer 222, is formed over insulating layer 212.

Insulating layer 212 has a reduced homogenous profile over semiconductor die 124. Insulating layer 212 does not completely cover semiconductor die 124 and insulating layer 212 includes vias 216 over insulating layer 142 which contribute to a reduction in the total homogenous area or volume of insulating layer 212 over semiconductor die 124. Build-up of stress within insulating layer 212 is minimized because stress imposed upon or absorbed by insulating layer 212 can travel a shorter distance across the reduced area of insulating layer 212 and dissipate more efficiently outside insulating layer 212. Stress can, for example, dissipate through vias 216. Consequently, the structural stability of insulating layer 212 is improved and the probability of crack formation or other structural defects in insulating layer 212 is decreased.

Further, with conductive joint structure 230, conductive layer 222, as a UBM, is disposed over insulating layer 212 which provides additional stress relief for conductive layer 222 and surrounding components. Conductive joint structure 230, with conductive layer 222 over insulating layer 212, provides an increase in the contact area or interface between insulating layer 212 and conductive layer 222. The increased contact area between insulating layer 212 and conductive layer 222 allows insulating layer 212 to absorb a greater amount of stress imposed on conductive layer 222. Unlike POU structures, conductive joint structure 230 decreases the physical connection between contact pads 134 and conductive layers 222 and 234. By reducing the metal-to-metal connection between conductive layers 222 and 234 and contact pads 134 while increasing the interface between conductive layers 222 and 234 and insulating layer 212, stress is minimized along conductive layers 222 and 234. As an additional advantage over POU structures, insulating layer 212 makes physical contact with contact pads 134 which allows insulating layer 212 to absorb stress imposed on contact pads 134. Conductive joint structure 230 optimizes the placement and design of insulating layer 212 to make maximum benefit of the structural qualities of insulating layer 212 as a stress relief buffer.

Conductive joint structure 230 provides enhanced stress relief to minimize the totality of different stress-related issues. Conductive joint structure 230 is not limited to minimization of particular forms of stress. Conductive joint structure 230 provides a combination of stress relief benefits and can minimize, e.g., UBM stress, ELK stress, bump stress, and stress imposed on intermetallic compound layers such as conductive layer 234. For example, insulating layer 212 minimizes stress for ELK layers, i.e., insulating layer 132, and reduces frequency of ELK cracking. Insulating layer 212 minimizes stress for insulating layer 142 by redistributing the stress profile to reduce cracking of insulating layer 142 over conductive layer 134. Insulating layer 212 minimizes stress imposed on UBM layers such as conductive layers 222 and IMC layers such as conductive layer 234. Insulating layer 212 minimizes stress for bumps 238 by redistributing the stress profile to reduce cracking and other interconnect defects. Conductive joint structure 230 provides multifaceted stress relief.

Under simulated test conditions, conductive joint structure 230, when compared to standard conductive joint structures, reduces stress imposed on an ELK layer by at least 8%, stress imposed on UBM layers by at least 16%, and stress imposed on IMC layers by at least 7%. Under the same conditions, when measuring stress imposed upon ELK layers, UBM layers, and IMC layers, conductive joint structure 230 outperforms POU structures, especially with respect to stress imposed on IMC layers. Furthermore, when compared to conventional manufacturing methods, conductive joint structure 230 does not require additional process steps and involves little to no additional cost.

Figure 10C:
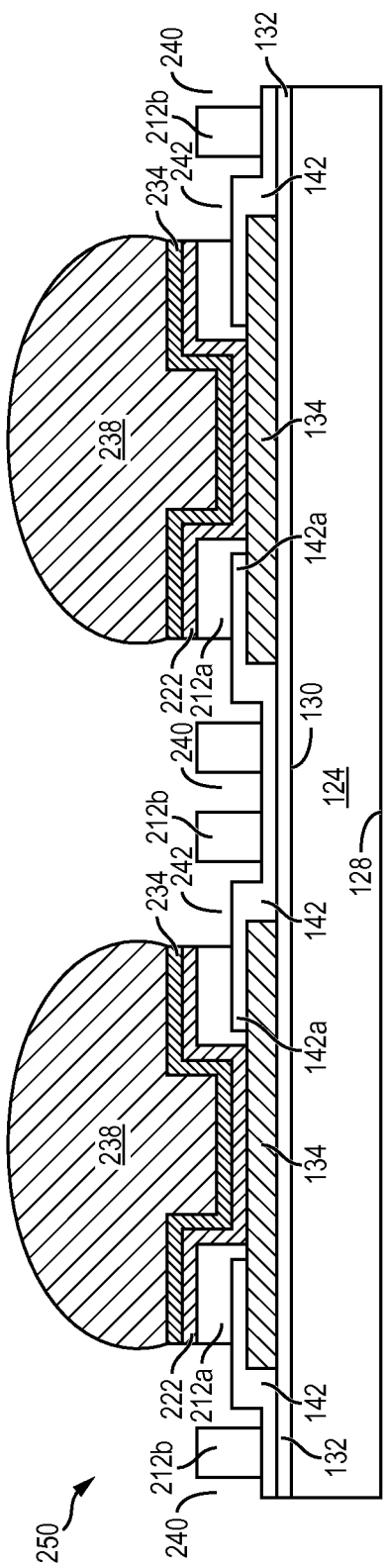

FIGS. 10a-10c illustrate another embodiment of a conductive joint structure formed over a semiconductor die using a process similar to FIGS. 9a-9f. FIG. 10a shows a variation of the step described in FIG. 9c. Continuing from FIG. 9b, a portion of insulating layer 212 from FIG. 9b is removed by an etching process or LDA to form vias or openings 218, vias or openings 242, and vias or openings 240.

In FIG. 10a, after the formation of vias 218, 242, and 240, insulating layer 212 is divided into first and second separate and isolated cylindrical regions disposed over insulating layer 142. First region 212a of insulating layer 212 partially covers region 142a of insulating layer 142. First region 212a of insulating layer 212 overlaps region 142a of insulating layer 142 on the surface of contact pads 134. Second region 212b of insulating layer 212 is disposed on a surface of insulating layer 142 around first region 212a as depicted in FIG. 10b. In some embodiments, region 212b of insulating layer 212 completely surrounds first region 212a. In some embodiments, second region 212b of insulating layer 212 has a concentric geometric relationship with respect to first region 212a of insulating layer 212 and second region 212b extends parallel to a perimeter of first region 212a. In some embodiments, contact pads 134 extend outside a footprint of region 212a of insulating layer 212 as shown in FIG. 10b.

In one embodiment, insulating layer 212 includes a polyimide layer comprising one or more cylindrical regions disposed over insulating layer 142. Alternatively, instead of modifying insulating layer 212 to show second region 212b of insulating layer 212, an additional insulating layer similar to insulating layer 212 may be formed over the structure in FIG. 9c to arrive at the structure shown in FIG. 10a.

Vias 218 have a width W2 and expose contact pads 134. The formation of vias 218 and vias 242 results in first region 212a of insulating layer 212 disposed over a perimeter of contact pads 134. Width W1 of vias 146 is greater than width W2 of vias 218, i.e., width W2 of vias 218 is smaller than width W1 of vias 146. Vias 218 of insulating layer 212 expose an area of contact pads 134 less than the area of contact pads 134 exposed by vias 146 of insulating layer 142. As shown in FIG. 10b, vias 242 separate first region 212a and second region 212b of insulating layer 212 and expose insulating layer 142 around a perimeter of first region 212a of insulating layer 212. Vias 240 expose insulating layer 142 around a perimeter of second region 212b of insulating layer 212 such that second region 212b terminates before reaching an edge of the semiconductor die 124.

FIG. 10c shows conductive joint structure 250 with insulating layer 212 as described in FIGS. 10a-10b after the formation of conductive layers 222 and 234 and after the formation of bumps 238 using a process similar to FIGS. 9e-9f. Conductive joint structure 250 can be formed at the wafer level using a process similar to FIGS. 9a-9f and FIGS. 10a-10b. Alternatively, conductive joint structure 250 can be formed after singulation of individual semiconductor die 124 from wafer 120.

Conductive joint structure 250 provides a unique and improved shape, size, and location for insulating layer 212 as compared to existing conductive joint structures. Insulating layer 212 operates as a stress relief buffer formed on insulating layer 142 and over a perimeter of contact pads 134 as a cylindered structure or ring. Insulating layer 212 is a departure from standard conductive joint structures which employ a flat continuous insulating layer across the entire surface of a passivation layer because portions of insulating layer 142 are exposed from insulating layer 212. Insulating layer 212 is formed at predetermined locations over contact pads 134. Insulating layer 212 includes an opening 218 with a width W2 smaller than the width W1 of opening 146 in insulating layer 142 which is different from POU structures. Unlike POU structures, the UBM layer, i.e., conductive layer 222, is formed over insulating layer 212.

Insulating layer 212 has a reduced homogenous profile over semiconductor die 124. Insulating layer 212 does not completely cover semiconductor die 124 and insulating layer 212 includes vias 242 and 240 over insulating layer 142 which contribute to a reduction in the total homogenous area or volume of insulating layer 212 over semiconductor die 124. Build-up of stress within insulating layer 212 is minimized because stress imposed upon or absorbed by insulating layer 212 can travel a shorter distance across the reduced area of insulating layer 212 and dissipate more efficiently outside insulating layer 212. Stress can, for example, dissipate through vias 242 or 240. Consequently, the structural stability of insulating layer 212 is improved and the probability of crack formation or other structural defects in insulating layer 212 is decreased.

Further, with conductive joint structure 250, conductive layer 222, as a UBM, is disposed over insulating layer 212 which provides additional stress relief for conductive layer 222 and surrounding components. Conductive joint structure 250, with conductive layer 222 over insulating layer 212, provides an increase in the contact area or interface between insulating layer 212 and conductive layer 222. The increased contact area between insulating layer 212 and conductive layer 222 allows insulating layer 212 to absorb a greater amount of stress imposed on conductive layer 222. Unlike POU structures, conductive joint structure 250 decreases the physical connection between contact pads 134 and conductive layers 222 and 234. By reducing the metal-to-metal connection between conductive layers 222 and 234 and contact pads 134 while increasing the interface between conductive layers 222 and 234 and insulating layer 212, stress is minimized along conductive layers 222 and 234. As an additional advantage over POU structures, insulating layer 212 makes physical contact with contact pads 134 which allows insulating layer 212 to absorb stress imposed on contact pads 134. Conductive joint structure 250 optimizes the placement and design of insulating layer 212 to make maximum benefit of the structural qualities of insulating layer 212 as a stress relief buffer.

Conductive joint structure 250 provides enhanced stress relief to minimize the totality of different stress-related issues. Conductive joint structure 250 is not limited to minimization of particular forms of stress. Conductive joint structure 250 provides a combination of stress relief benefits and can minimize, e.g., UBM stress, ELK stress, bump stress, and stress imposed on intermetallic compound layers such as conductive layer 234. For example, insulating layer 212 minimizes stress for ELK layers, i.e., insulating layer 132, and reduces frequency of ELK cracking. Insulating layer 212 minimizes stress for insulating layer 142 by redistributing the stress profile to reduce cracking of insulating layer 142 over conductive layer 134. Insulating layer 212 minimizes stress imposed on UBM layers such as conductive layers 222 and IMC layers such as conductive layer 234. Insulating layer 212 minimizes stress for bumps 238 by redistributing the stress profile to reduce cracking and other interconnect defects. Conductive joint structure 250 provides multifaceted stress relief.

Second region 212b, combined with first region 212a, increases the total area of insulating layer 212 disposed over insulating layer 142. Consequently, insulating layer 212, as a stress relief buffer, is expanded to provide maximum stress relief coverage across conductive joint structure 250. Vias 242 and 240 provide breaks within insulating layer 212 for stress dissipation and structural reliability.

Under simulated test conditions, conductive joint structure 250, when compared to standard conductive joint structures, reduces stress imposed on an ELK layer by at least 6%, stress imposed on UBM layers by at least 11%, and stress imposed on IMC layers by at least 7%. Under the same conditions, when measuring stress imposed upon ELK layers, UBM layers, and IMC layers, conductive joint structure 250 outperforms POU structures, especially with respect to stress imposed on IMC layers. Furthermore, when compared to conventional manufacturing methods, conductive joint structure 250 does not require additional process steps and involves little to no additional cost.

Figure 11C:
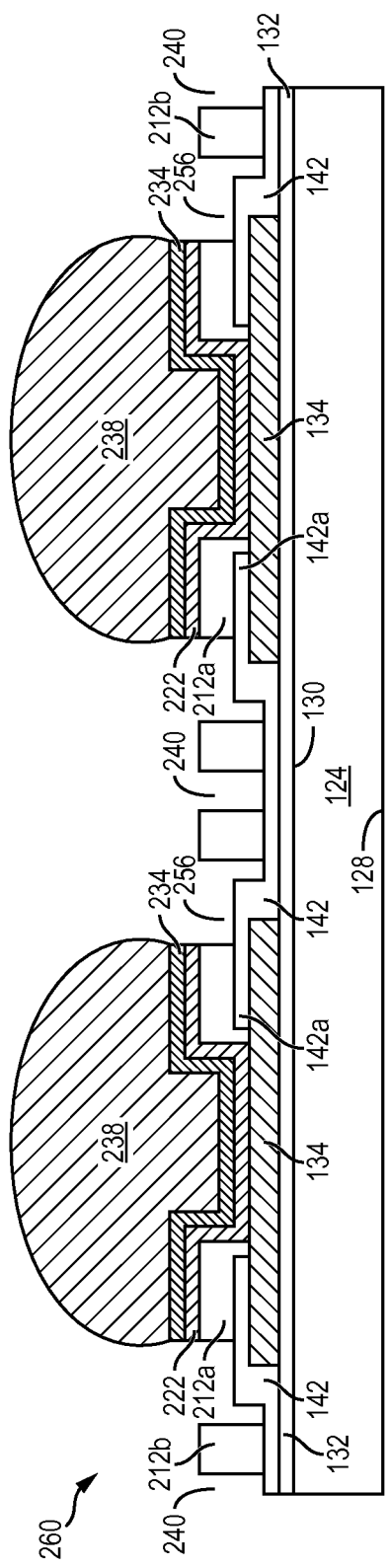

FIGS. 11a-11c illustrate another embodiment of a conductive joint structure formed over a semiconductor die using a process similar to FIGS. 9a-9f. FIG. 11a shows a variation of the step described in FIG. 9c. Continuing from FIG. 9b, a portion of insulating layer 212 from FIG. 9b is removed by an etching process or LDA to form vias or openings 218, vias or openings 256, and vias or openings 240.

In FIG. 11a, after the formation of vias 218, 256, and 240, insulating layer 212 is divided into first and second cylindrical regions disposed over insulating layer 142. First region 212a of insulating layer 212 partially covers region 142a of insulating layer 142. First region 212a of insulating layer 212 overlaps region 142a of insulating layer 142 on the surface of contact pads 134. Second region 212b of insulating layer 212 is disposed on a surface of insulating layer 142 around first region 212a as depicted in FIG. 11b. In some embodiments, region 212b of insulating layer 212 completely surrounds first region 212a. In some embodiments, second region 212b of insulating layer 212 has a concentric geometric relationship with respect to first region 212a of insulating layer 212.

In one embodiment, insulating layer 212 includes a polyimide layer comprising one or more cylindrical regions disposed over insulating layer 142. Alternatively, instead of modifying insulating layer 212 to show second region 212b of insulating layer 212, an additional insulating layer similar to insulating layer 212 may be formed over the structure in FIG. 9c to arrive at the structure shown in FIG. 11a.

Vias 218 have a width W2 and partially expose contact pads 134. The formation of vias 218 and vias 256 results in first region 212a of insulating layer 212 disposed over a perimeter of contact pads 134. Width W1 of vias 146 is greater than width W2 of vias 218, i.e., width W2 of vias 218 is smaller than width W1 of vias 146. Vias 218 of insulating layer 212 expose an area of contact pads 134 less than the area of contact pads 134 exposed by vias 146 of insulating layer 142.

As further shown in FIG. 11b, vias 256 comprise slots, or channels to expose portions of insulating layer 142 between first region 212a and second region 212b of insulating layer 212. Due to the shape of vias 256, insulating layer 212 includes bridges or cross-bars which connect first region 212a and second region 212b between vias 256. Vias 240 expose insulating layer 142 around a perimeter of second region 212b of insulating layer 212 such that second region 212b terminates before reaching an edge of the semiconductor die 124.

FIG. 11c shows conductive joint structure 260 with insulating layer 212 as described in FIGS. 11a-11b after the formation of conductive layers 222 and 234 and after the formation of bumps 238 using a process similar to FIGS. 9e-9f. Conductive joint structure 260 can be formed at the wafer level using a process similar to FIGS. 9a-9f and FIGS. 11a-11b. Alternatively, conductive joint structure 260 can be formed after singulation of individual semiconductor die 124 from wafer 120.

Conductive joint structure 260 provides a unique and improved shape, size, and location for insulating layer 212 as compared to existing conductive joint structures. Insulating layer 212 operates as a stress relief buffer formed on insulating layer 142 and over a perimeter of contact pads 134 as a cylindered structure or ring. Insulating layer 212 is a departure from standard conductive joint structures which employ a flat continuous insulating layer across the entire surface of a passivation layer because portions of insulating layer 142 are exposed from insulating layer 212. Insulating layer 212 is formed at predetermined locations over contact pads 134. Insulating layer 212 includes an opening 218 with a width W2 smaller than the width W1 of opening 146 in insulating layer 142 which is different from POU structures. Unlike POU structures, the UBM layer, i.e., conductive layer 222, is formed over insulating layer 212.

Insulating layer 212 has a reduced homogenous profile over semiconductor die 124. Insulating layer 212 does not completely cover semiconductor die 124 and insulating layer 212 includes vias 256 and 240 over insulating layer 142 which contribute to a reduction in the total homogenous area or volume of insulating layer 212 over semiconductor die 124. Build-up of stress within insulating layer 212 is minimized because stress imposed upon or absorbed by insulating layer 212 can travel a shorter distance across the reduced area of insulating layer 212 and dissipate more efficiently outside insulating layer 212. Stress can, for example, dissipate through vias 256 or 240. Consequently, the structural stability of insulating layer 212 is improved and the probability of crack formation or other structural defects in insulating layer 212 is decreased.

Further, with conductive joint structure 260, conductive layer 222, as a UBM, is disposed over insulating layer 212 which provides additional stress relief for conductive layer 222 and surrounding components. Conductive joint structure 260, with conductive layer 222 over insulating layer 212, provides an increase in the contact area or interface between insulating layer 212 and conductive layer 222. The increased contact area between insulating layer 212 and conductive layer 222 allows insulating layer 212 to absorb a greater amount of stress imposed on conductive layer 222. Unlike POU structures, conductive joint structure 260 decreases the physical connection between contact pads 134 and conductive layers 222 and 234. By reducing the metal-to-metal connection between conductive layers 222 and 234 and contact pads 134 while increasing the interface between conductive layers 222 and 234 and insulating layer 212, stress is minimized along conductive layers 222 and 234. As an additional advantage over POU structures, insulating layer 212 makes physical contact with contact pads 134 which allows insulating layer 212 to absorb stress imposed on contact pads 134. Conductive joint structure 260 optimizes the placement and design of insulating layer 212 to make maximum benefit of the structural qualities of insulating layer 212 as a stress relief buffer.

Conductive joint structure 260 provides enhanced stress relief to minimize the totality of different stress-related issues. Conductive joint structure 260 is not limited to minimization of particular forms of stress. Conductive joint structure 260 provides a combination of stress relief benefits and can minimize, e.g., UBM stress, ELK stress, bump stress, and stress imposed on intermetallic compound layers such as conductive layer 234. For example, insulating layer 212 minimizes stress for ELK layers, i.e., insulating layer 132, and reduces frequency of ELK cracking. Insulating layer 212 minimizes stress for insulating layer 142 by redistributing the stress profile to reduce cracking of insulating layer 142 over conductive layer 134. Insulating layer 212 minimizes stress imposed on UBM layers such as conductive layers 222 and IMC layers such as conductive layer 234. Insulating layer 212 minimizes stress for bumps 238 by redistributing the stress profile to reduce cracking and other interconnect defects. Conductive joint structure 260 provides multifaceted stress relief.

Second region 212b, combined with first region 212a, increases the total area of insulating layer 212 disposed over insulating layer 142. Consequently, insulating layer 212, as a stress relief buffer, is expanded to provide maximum stress relief coverage across conductive joint structure 260. Vias 256 and 240 provide breaks within insulating layer 212 for stress dissipation and structural reliability.

Under simulated test conditions, conductive joint structure 260, when compared to standard conductive joint structures, reduces stress imposed on an ELK layer by at least 6%, stress imposed on UBM layers by at least 11%, and stress imposed on IMC layers by at least 7%. Under the same conditions, when measuring stress imposed upon ELK layers, UBM layers, and IMC layers, conductive joint structure 260 outperforms POU structures, especially with respect to stress imposed on IMC layers. Furthermore, when compared to conventional manufacturing methods, conductive joint structure 260 does not require additional process steps and involves little to no additional cost.

Figure 12A:
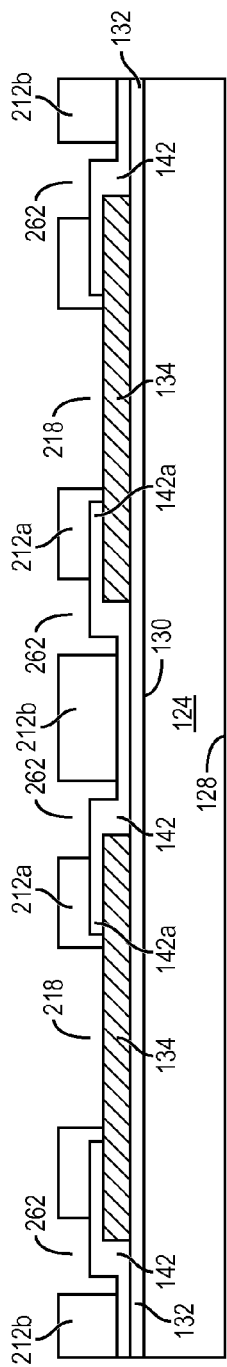
FIGS. 12a-12c illustrate another embodiment of a conductive joint structure formed over a semiconductor die using a process similar to FIGS. 9a-9f.
Figure 12B:
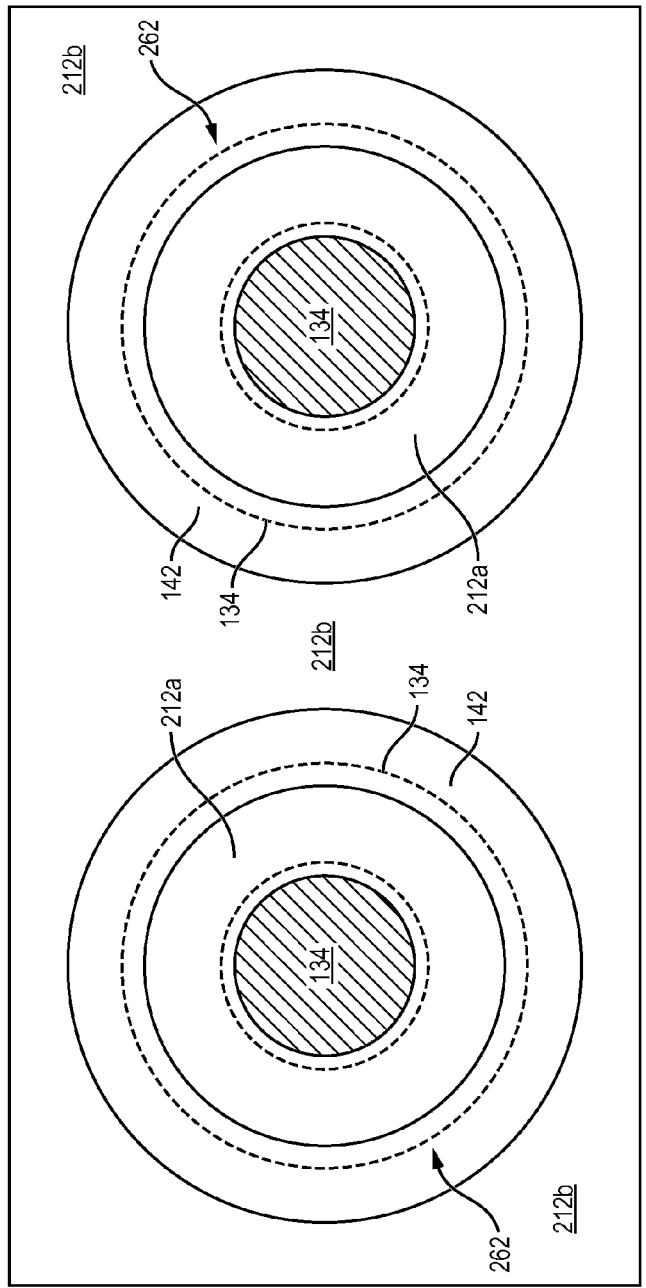
Figure 12C:
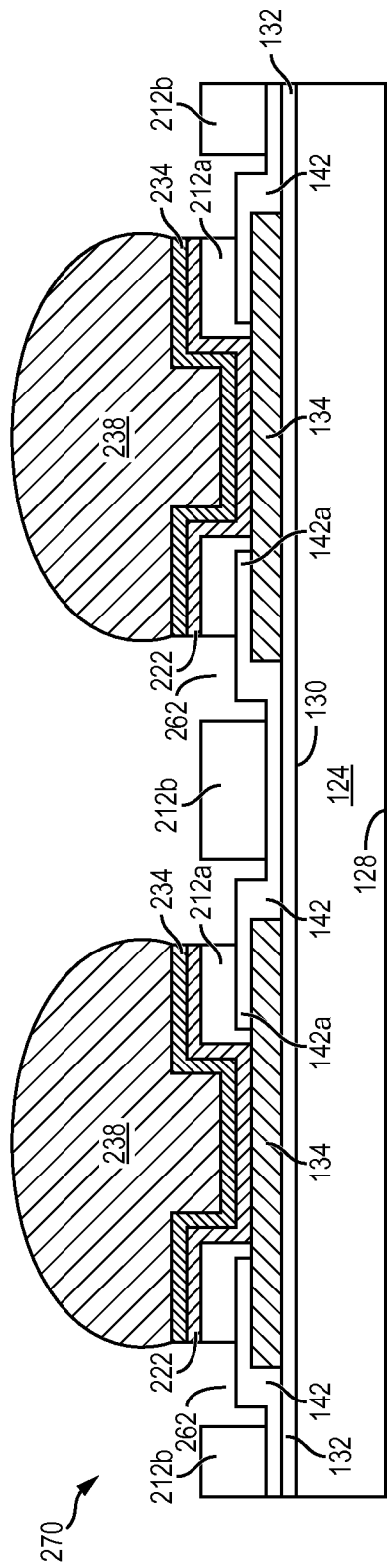

FIGS. 12a-12c illustrate another embodiment of a conductive joint structure formed over a semiconductor die using a process similar to FIGS. 9a-9f. FIG. 12a shows a variation of the step described in FIG. 9c. Continuing from FIG. 9b, a portion of insulating layer 212 from FIG. 9b is removed by an etching process or LDA to form vias or openings 218 and vias or openings 262.

In FIG. 12a, after the formation of vias 218 and 262, insulating layer 212 is divided into first and second separate and isolated regions disposed over insulating layer 142. First region 212a of insulating layer 212 partially covers region 142a of insulating layer 142. First region 212a of insulating layer 212 overlaps region 142a of insulating layer 142 on the surface of contact pads 134. Second region 212b of insulating layer 212 is disposed on a surface of insulating layer 142 around first region 212a as depicted in FIG. 12b. In some embodiments, region 212b of insulating layer 212 completely surrounds first region 212a. In some embodiments, second region 212b of insulating layer 212 has a concentric geometric relationship with respect to first region 212a of insulating layer 212. In one embodiment, second region 212b extends to an edge of semiconductor die 124.

In one embodiment, insulating layer 212 includes a polyimide layer comprising one or more cylindrical regions over insulating layer 142. Alternatively, instead of modifying insulating layer 212 to show second region 212b of insulating layer 212, an additional insulating layer similar to insulating layer 212 may be formed over the structure in FIG. 9c to arrive at the structure shown in FIG. 12a.

Vias 218 have a width W2 and partially expose contact pads 134. The formation of vias 218 and vias 146 results in first region 212a of insulating layer 212 overlapping a perimeter of contact pads 134. Width W1 of vias 146 is greater than width W2 of vias 218, i.e., width W2 of vias 218 is smaller than width W1 of vias 146. Vias 218 of insulating layer 212 expose an area of contact pads 134 less than the area of contact pads 134 exposed by vias 146 of insulating layer 142. As shown in FIG. 12b, vias 262 separate first region 212a and second region 212b of insulating layer 212 and expose insulating layer 142 around a perimeter of first region 212a of insulating layer 212.

FIG. 12c shows conductive joint structure 270 with insulating layer 212 as described in FIGS. 12a-12b after the formation of conductive layers 222 and 234 and after the formation of bumps 238 using a process similar to FIGS. 9e-9f. Conductive joint structure 270 can be formed at the wafer level using a process similar to FIGS. 9a-9f and FIGS. 12a-12b. Alternatively, conductive joint structure 270 can be formed after singulation of individual semiconductor die 124 from wafer 120.

Conductive joint structure 270 provides a unique and improved shape, size, and location for insulating layer 212 as compared to existing conductive joint structures. Insulating layer 212 operates as a stress relief buffer formed on insulating layer 142 and over a perimeter of contact pads 134 as a cylindered structure or ring. Insulating layer 212 is a departure from standard conductive joint structures which employ a flat continuous insulating layer across the entire surface of a passivation layer because portions of insulating layer 142 are exposed from insulating layer 212. Insulating layer 212 is formed at predetermined locations over contact pads 134. Insulating layer 212 includes an opening 218 with a width W2 smaller than the width W1 of opening 146 in insulating layer 142 which is different from POU structures. Unlike POU structures, the UBM layer, i.e., conductive layer 222, is formed over insulating layer 212.

Insulating layer 212 has a reduced homogenous profile over semiconductor die 124. Insulating layer 212 does not completely cover semiconductor die 124 and insulating layer 212 includes vias 262 over insulating layer 142 which contribute to a reduction in the total homogenous area or volume of insulating layer 212 over semiconductor die 124. Build-up of stress within insulating layer 212 is minimized because stress imposed upon or absorbed by insulating layer 212 can travel a shorter distance across the reduced area of insulating layer 212 and dissipate more efficiently outside insulating layer 212. Stress can, for example, dissipate through vias 262. Consequently, the structural stability of insulating layer 212 is improved and the probability of crack formation or other structural defects in insulating layer 212 is decreased.

Further, with conductive joint structure 270, conductive layer 222, as a UBM, is disposed over insulating layer 212 which provides additional stress relief for conductive layer 222 and surrounding components. Conductive joint structure 270, with conductive layer 222 over insulating layer 212, provides an increase in the contact area or interface between insulating layer 212 and conductive layer 222. The increased contact area between insulating layer 212 and conductive layer 222 allows insulating layer 212 to absorb a greater amount of stress imposed on conductive layer 222. Unlike POU structures, conductive joint structure 270 decreases the physical connection between contact pads 134 and conductive layers 222 and 234. By reducing the metal-to-metal connection between conductive layers 222 and 234 and contact pads 134 while increasing the interface between conductive layers 222 and 234 and insulating layer 212, stress is minimized along conductive layers 222 and 234. As an additional advantage over POU structures, insulating layer 212 makes physical contact with contact pads 134 which allows insulating layer 212 to absorb stress imposed on contact pads 134. Conductive joint structure 270 optimizes the placement and design of insulating layer 212 to make maximum benefit of the structural qualities of insulating layer 212 as a stress relief buffer.

Conductive joint structure 270 provides enhanced stress relief to minimize the totality of different stress-related issues. Conductive joint structure 270 is not limited to minimization of particular forms of stress. Conductive joint structure 270 provides a combination of stress relief benefits and can minimize, e.g., UBM stress, ELK stress, bump stress, and stress imposed on intermetallic compound layers such as conductive layer 234. For example, insulating layer 212 provides stress relief for ELK layers, i.e., insulating layer 132, and reduces frequency of ELK cracking. Insulating layer 212 provides stress relief for insulating layer 142 by redistributing the stress profile to reduce cracking of insulating layer 142 over conductive layer 134. Insulating layer 212 minimizes stress imposed on UBM layers such as conductive layers 222 and IMC layers such as conductive layer 234. Insulating layer 212 provides stress relief for bumps 238 by redistributing the stress profile to reduce cracking and other interconnect defects. Conductive joint structure 270 provides multifaceted stress relief.

Second region 212b, combined with first region 212a, increases the total area of insulating layer 212 disposed over insulating layer 142. Consequently, insulating layer 212, as a stress relief buffer, is expanded to provide maximum stress relief coverage across conductive joint structure 270. Vias 262 provide breaks within insulating layer 212 for stress dissipation and structural reliability.

Under simulated test conditions, conductive joint structure 270, when compared to standard conductive joint structures, reduces stress imposed on an ELK layer by at least 6%, stress imposed on UBM layers by at least 11%, and stress imposed on IMC layers by at least 7%. Under the same conditions, when measuring stress imposed upon ELK layers, UBM layers, and IMC layers, conductive joint structure 270 outperforms POU structures, especially with respect to stress imposed on IMC layers. Furthermore, when compared to conventional manufacturing methods, conductive joint structure 270 does not require additional process steps and involves little to no additional cost.

FIGS. 13a-13c illustrate another embodiment of a conductive joint structure formed over a semiconductor die using a process similar to FIGS. 9a-9f. FIG. 13a shows a variation of the step described in FIG. 9c. Continuing from FIG. 9b, a portion of insulating layer 212 from FIG. 9b is removed by an etching process or LDA to form vias or openings 218 and vias or openings 272.

In FIG. 13a, after the formation of vias 218 and 272, insulating layer 212 is divided into first and second regions disposed around contact pads 134. First region 212a of insulating layer 212 partially covers region 142a of insulating layer 142. First region 212a of insulating layer 212 overlaps region 142a of insulating layer 142 on the surface of contact pads 134. Second region 212b of insulating layer 212 is disposed on a surface of insulating layer 142 around first region 212a as depicted in FIG. 13b. In some embodiments, region 212b of insulating layer 212 completely surrounds first region 212a. In some embodiments, second region 212b of insulating layer 212 has a concentric geometric relationship with respect to first region 212a of insulating layer 212. In one embodiment, second region 212b extends to an edge of semiconductor die 124.

In one embodiment, insulating layer 212 includes a polyimide layer comprising one or more cylindrical regions over insulating layer 142. Alternatively, instead of modifying insulating layer 212 to show second region 212b of insulating layer 212, an additional insulating layer similar to insulating layer 212 may be formed over the structure in FIG. 9c to arrive at the structure shown in FIG. 13a.

Vias 218 have a width W2 and partially expose contact pads 134. The formation of vias 218 and vias 272 results in first region 212a of insulating layer 212 overlapping a perimeter of contact pads 134. Width W1 of vias 146 is greater than width W2 of vias 218, i.e., width W2 of vias 218 is smaller than width W1 of vias 146. Vias 218 of insulating layer 212 expose an area of contact pads 134 less than the area of contact pads 134 exposed by vias 146 of insulating layer 142.

As further shown in FIG. 13b, vias 272 comprise slots, or channels to expose portions of insulating layer 142 between first region 212a and second region 212b of insulating layer 212. Due to the shape of vias 272, insulating layer 212 includes bridges or cross-bars which connect first region 212a and second region 212b between vias 272.

FIG. 13c shows conductive joint structure 280 with insulating layer 212 as described in FIGS. 13a-13b after the formation of conductive layers 222 and 234 and after the formation of bumps 238 using a process similar to FIGS. 9e-9f. Conductive joint structure 280 can be formed at the wafer level using a process similar to FIGS. 9a-9f and FIGS. 13a-13b. Alternatively, conductive joint structure 280 can be formed after singulation of individual semiconductor die 124 from wafer 120.

Conductive joint structure 280 provides a unique and improved shape, size, and location for insulating layer 212 as compared to existing conductive joint structures. Insulating layer 212 operates as a stress relief buffer formed on insulating layer 142 and over a perimeter of contact pads 134 as a cylindered structure or ring. Insulating layer 212 is a departure from standard conductive joint structures which employ a flat continuous insulating layer across the entire surface of a passivation layer because portions of insulating layer 142 are exposed from insulating layer 212. Insulating layer 212 is formed at predetermined locations over contact pads 134. Insulating layer 212 includes an opening 218 with a width W2 smaller than the width W1 of opening 146 in insulating layer 142 which is different from POU structures. Unlike POU structures, the UBM layer, i.e., conductive layer 222, is formed over insulating layer 212.

Insulating layer 212 has a reduced homogenous profile over semiconductor die 124. Insulating layer 212 does not completely cover semiconductor die 124 and insulating layer 212 includes vias 272 over insulating layer 142 which contribute to a reduction in the total homogenous area or volume of insulating layer 212 over semiconductor die 124. Build-up of stress within insulating layer 212 is minimized because stress imposed upon or absorbed by insulating layer 212 can travel a shorter distance across the reduced area of insulating layer 212 and dissipate more efficiently outside insulating layer 212. Stress can, for example, dissipate through vias 272. Consequently, the structural stability of insulating layer 212 is improved and the probability of crack formation or other structural defects in insulating layer 212 is decreased.

Further, with conductive joint structure 280, conductive layer 222, as a UBM, is disposed over insulating layer 212 which provides additional stress relief for conductive layer 222 and surrounding components. Conductive joint structure 280, with conductive layer 222 over insulating layer 212, provides an increase in the contact area or interface between insulating layer 212 and conductive layer 222. The increased contact area between insulating layer 212 and conductive layer 222 allows insulating layer 212 to absorb a greater amount of stress imposed on conductive layer 222. Unlike POU structures, conductive joint structure 280 decreases the physical connection between contact pads 134 and conductive layers 222 and 234. By reducing the metal-to-metal connection between conductive layers 222 and 234 and contact pads 134 while increasing the interface between conductive layers 222 and 234 and insulating layer 212, stress is minimized along conductive layers 222 and 234. As an additional advantage over POU structures, insulating layer 212 makes physical contact with contact pads 134 which allows insulating layer 212 to absorb stress imposed on contact pads 134. Conductive joint structure 280 optimizes the placement and design of insulating layer 212 to make maximum benefit of the structural qualities of insulating layer 212 as a stress relief buffer.

Conductive joint structure 280 provides enhanced stress relief to minimize the totality of different stress-related issues. Conductive joint structure 280 is not limited to minimization of particular forms of stress. Conductive joint structure 280 provides a combination of stress relief benefits and can minimize, e.g., UBM stress, ELK stress, bump stress, and stress imposed on intermetallic compound layers such as conductive layer 234. For example, insulating layer 212 provides stress relief for ELK layers, i.e., insulating layer 132, and reduces frequency of ELK cracking. Insulating layer 212 provides stress relief for insulating layer 142 by redistributing the stress profile to reduce cracking of insulating layer 142 over conductive layer 134. Insulating layer 212 minimizes stress imposed on UBM layers such as conductive layers 222 and IMC layers such as conductive layer 234. Insulating layer 212 provides stress relief for bumps 238 by redistributing the stress profile to reduce cracking and other interconnect defects. Conductive joint structure 280 provides multifaceted stress relief.

Second region 212b, combined with first region 212a, increases the total area of insulating layer 212 disposed over insulating layer 142. Consequently, insulating layer 212, as a stress relief buffer, is expanded to provide maximum stress relief coverage across conductive joint structure 280. Vias 272 provide breaks within insulating layer 212 for stress dissipation and structural reliability.

Under simulated test conditions, conductive joint structure 280, when compared to standard conductive joint structures, reduces stress imposed on an ELK layer by at least 6%, stress imposed on UBM layers by at least 11%, and stress imposed on IMC layers by at least 7%. Under the same conditions, when measuring stress imposed upon ELK layers, UBM layers, and IMC layers, conductive joint structure 280 outperforms POU structures, especially with respect to stress imposed on IMC layers. Furthermore, when compared to conventional manufacturing methods, conductive joint structure 280 does not require additional process steps and involves little to no additional cost.

Figure 14A:
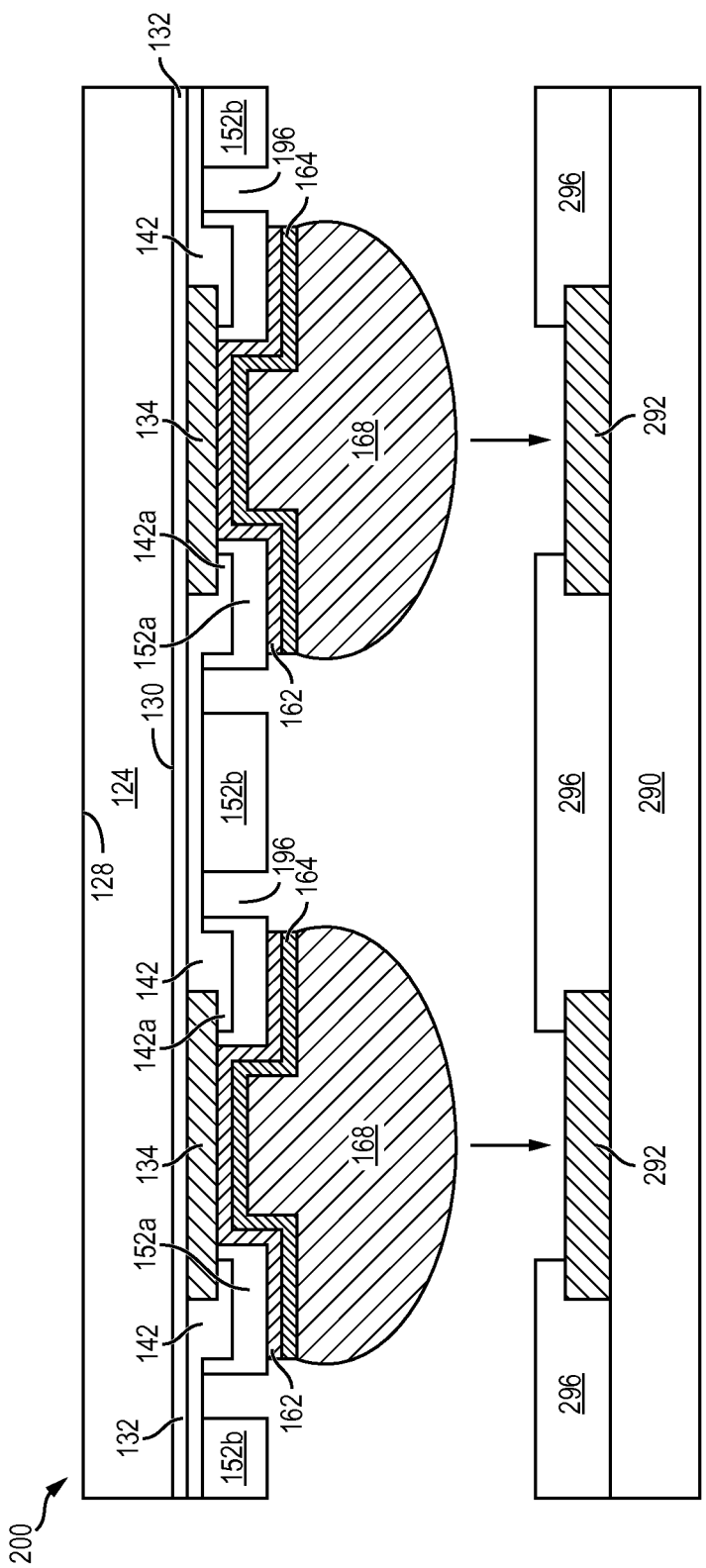
FIGS. 14a-14d illustrate further detail of the embodiment shown in FIGS. 7a-7c including mounting a semiconductor die with a conductive joint structure to a substrate.

FIGS. 14a-14d illustrate further detail of the embodiment shown in FIGS. 7a-7c including mounting semiconductor die 124 with conductive joint structure 200 to a substrate. FIG. 14a shows semiconductor die 124 with conductive joint structure 200 being mounted to substrate 290 to form a semiconductor package 300. In one embodiment, semiconductor package 300 can be a flip chip package.

Substrate or PCB 290 contains one or more laminated layers of prepreg, FR-4, FR-1, CEM-1, or CEM-3 with a combination of phenolic cotton paper, epoxy, resin, woven glass, matte glass, polyester, and other reinforcement fibers or fabrics. Substrate 290 can also be a multi-layer flexible laminate, ceramic, copper foil, glass, or semiconductor wafer including an active surface containing one or more transistors, diodes, and other circuit elements to implement analog circuits or digital circuits. In one embodiment, substrate 290 includes a base substrate material such as silicon, germanium, aluminum phosphide, aluminum arsenide, gallium arsenide, gallium nitride, indium phosphide, silicon carbide, or other bulk semiconductor material for structural support. Substrate 290 may include insulating and conductive layers formed within substrate 290 depending on the functionality and specifications of substrate 290 and semiconductor die 124.

An electrically conductive layer 292 is formed over substrate 290 using PVD, CVD, electrolytic plating, electroless plating process, or other suitable metal deposition process. Conductive layer 292 can be one or more layers of Al, Cu, Sn, Ni, Au, Ag, or other suitable electrically conductive material. Conductive layer 292 operates as contact pads, pins, or traces electrically connected to substrate 290. Conductive layer 292 can be disposed as contact pads side-by-side a first distance from the edge of substrate 290, as shown in FIG. 14a. Alternatively, conductive layer 292 can be offset in multiple rows such that conductive layer 292 includes a first row of contact pads disposed a first distance from the edge of the substrate 290, and a second row of contact pads alternating with the first row and disposed a second distance from the edge of substrate 290.

A solder resist layer, insulating or passivation layer 296 is formed over conductive layer 292 using PVD, CVD, printing, spin coating, spray coating, sintering or thermal oxidation. Solder resist layer 296 contains one or more layers of $SiO_2$, $Si_3N_4$, $SiON$, $Ta_2O_5$, $Al_2O_3$, $HfO_2$, BCB, PI, PBO, or other suitable insulating material. A portion of solder resist layer 296 is removed by an etching process or LDA to form vias or openings over conductive layer 292 and partially expose conductive layer 292.

Figure 14B:
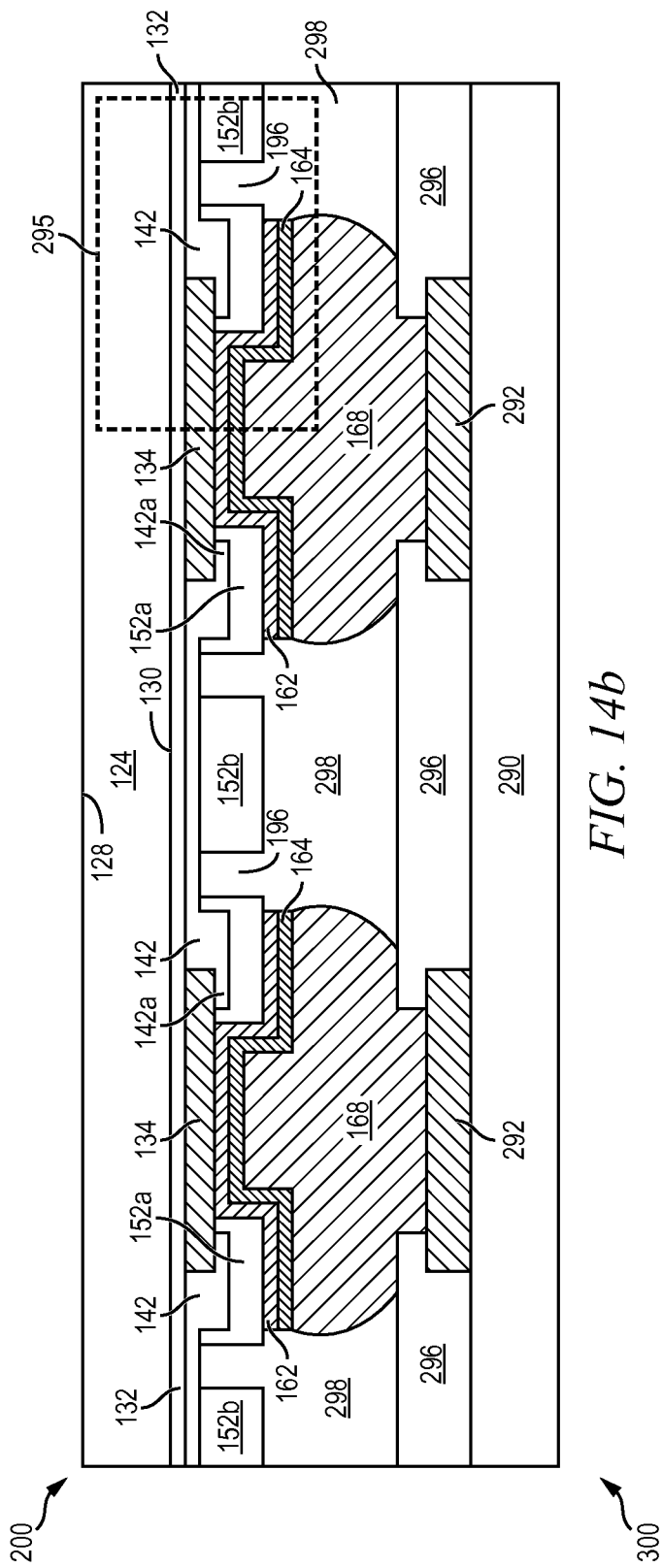

Semiconductor die 124, with conductive joint structure 200, is mounted to substrate 290 using a pick and place operation with active surface 130 and bumps 168 oriented toward substrate 290 to form semiconductor package 300. FIG. 14b shows semiconductor die 124 mounted to substrate 290. Additional electrically conductive layers and insulating layers may be formed over substrate 290 prior to mounting semiconductor die 124. Bumps 168 are electrically connected to conductive layer 292. Bumps 168 are bonded to conductive layer 292 using a suitable attachment or bonding process. In one embodiment, bumps 168 are reflowed by heating the bump material above its melting point. In some applications, bumps 168 are reflowed a second time to improve electrical contact to conductive layer 292. Bumps 168 can also be compression bonded to conductive layer 292.

FIG. 14b further shows an underfill material 298, such as epoxy resin, is deposited between semiconductor die 124 and substrate 290 and around bumps 168. Underfill material 298 can be an encapsulant, molding compound, or polymer composite material, such as epoxy resin with filler, epoxy acrylate with filler, or polymer with proper filler. Underfill material 298 is cured. Underfill material 298 is non-conductive and environmentally protects the semiconductor device from external elements and contaminants.

Figure 14C:
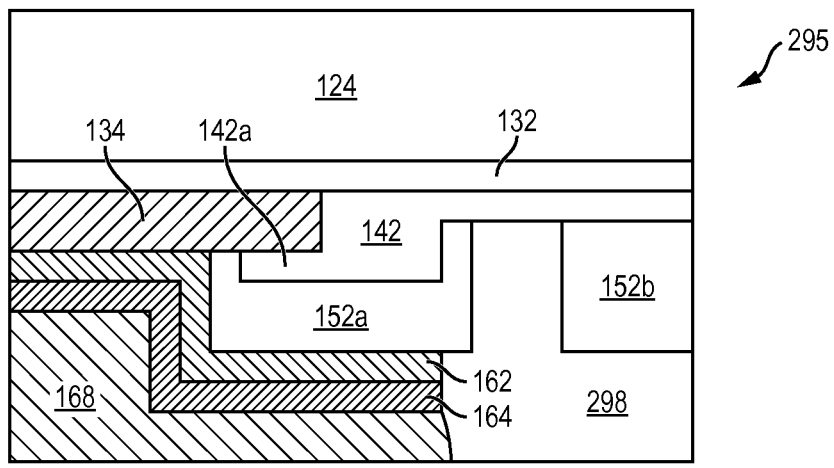
Figure 14D:
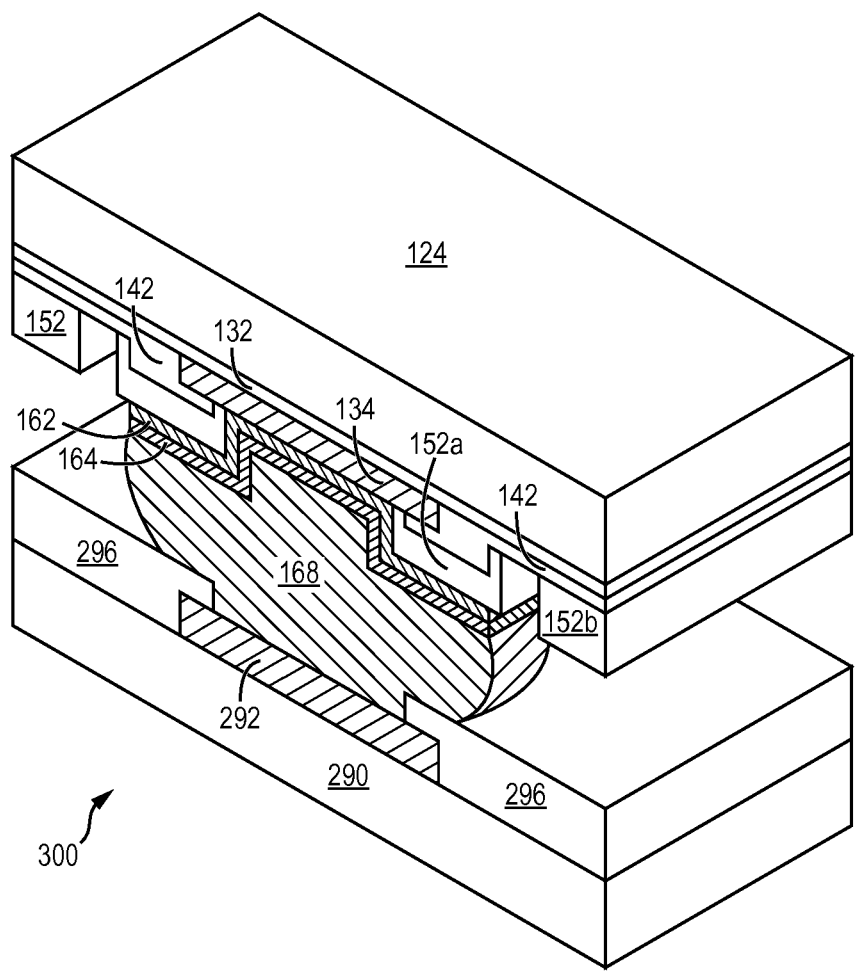

FIG. 14c shows a magnified view of a portion 295 of semiconductor package 300 identified in FIG. 14b providing further detail of conductive joint structure 200. FIG. 14c illustrates vias 196 providing a break between regions 152a and 152b. Region 152a covers region 142a. Insulating layer 152 provides optimal coverage over conductive joint components susceptible to high stress levels such as conductive layer 162, insulating layer 142, and contact pads 134. FIG. 14d shows an angled view of a portion of semiconductor package 300 to illustrate further detail regarding the relationship between conductive joint structure 200 of semiconductor die 124 and substrate 290.

With semiconductor package 300, semiconductor die 124 is firmly mounted to substrate 290 with conductive joint structure 200 providing maximum stress reduction. Conductive joint structure 200 provides enhanced stress relief to minimize the totality of different stress-related issues. For example, conductive layer 162, as a UBM, is disposed over insulating layer 152 which provides additional stress relief for conductive layer 162 and surrounding components. Vias 196 provide breaks within insulating layer 152 for stress dissipation and structural reliability. Conductive joint structure 200 optimizes the placement and design of insulating layer 152 to make maximum benefit of the structural qualities of insulating layer 152 as a stress relief buffer. As a result, semiconductor package 300 has increased reliability and can withstand greater levels of stress imposed on conductive joint structure 200.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a substrate;
    forming a first conductive layer over the substrate;
    forming a first insulating layer over the substrate and overlapping the first conductive layer;
    removing a portion of the first insulating layer over the substrate and outside the first conductive layer to form a first region of the first insulating layer stepped down from a second region of the first insulating layer at least partially overlapping the first conductive layer;
    forming a second insulating layer over the first insulating layer by,
        (a) forming a first ring of the second insulating layer extending from the first region of the first insulating layer over the second region of the first insulating layer and extending to contact the first conductive layer, and
        (b) forming a second ring of the second insulating layer over the first region of the first insulating layer; and
    forming a second conductive layer over the first ring of the second insulating layer and the first conductive layer.

2. The method of claim 1, further including forming the second conductive layer as an under bump metallization layer.

3. The method of claim 1, wherein forming the second insulating layer further includes:
    forming a first opening in the second insulating layer to form the first ring of the second insulating layer; and
    forming a second opening in the second insulating layer around the first opening in the second insulating layer to form the second ring of the second insulating layer.

4. The method of claim 1, further including:
    forming an opening in the first insulating layer over the first conductive layer; and
    forming an opening in the second insulating layer over the first conductive layer, wherein the opening of the first insulating layer is greater than the opening of the second insulating layer.

5. The method of claim 1, further including forming a slot in the second insulating layer.

6. The method of claim 1, further including forming an interconnect structure over the second insulating layer and conductive layer.

7. A method of making a semiconductor device, comprising:
    providing a substrate;
    forming a conductive layer over the substrate;
    forming a first insulating layer over the substrate and overlapping the conductive layer;
    removing a portion of the first insulating layer over the substrate away from the conductive layer to form a first region of the first insulating layer stepped down from a second region of the first insulating layer overlapping the conductive layer; and
    forming a second insulating layer as a ring extending from the first region of the first insulating layer over the second region of the first insulating layer.

8. The method of claim 7, further including forming a plurality of openings in the second insulating layer.

9. The method of claim 7, further including removing a portion of the second insulating layer to expose the conductive layer.

10. The method of claim 7, further including forming an under bump metallization layer over the second insulating layer and conductive layer.

11. The method of claim 7, further including disposing an interconnect structure within an opening of the second insulating layer over the conductive layer.

12. The method of claim 7, further including forming a third insulating layer between the conductive layer and substrate.

13. The method of claim 7, wherein the second insulating layer includes polyimide.

14. The method of claim 7, further including forming a slot in the second insulating layer.

* * * * *